United States Patent
Hiramatsu et al.

(10) Patent No.: US 6,891,263 B2
(45) Date of Patent: May 10, 2005

(54) CERAMIC SUBSTRATE FOR A SEMICONDUCTOR PRODUCTION/INSPECTION DEVICE

(75) Inventors: Yasuji Hiramatsu, Gifu (JP); Yasutaka Ito, Gifu (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 09/926,297
(22) PCT Filed: Feb. 7, 2001
(86) PCT No.: PCT/JP01/00866
§ 371 (c)(1), (2), (4) Date: Dec. 26, 2001
(87) PCT Pub. No.: WO01/58828
PCT Pub. Date: Aug. 16, 2001

(65) Prior Publication Data
US 2003/0047802 A1 Mar. 13, 2003

(30) Foreign Application Priority Data
Feb. 7, 2000 (JP) ....................... 2000-029279

(51) Int. Cl.⁷ .................... H01L 23/06; H01L 23/10; H01L 23/15
(52) U.S. Cl. .................. 257/703; 257/700; 257/705; 219/444.1; 219/544; 219/553; 118/724; 118/725
(58) Field of Search ................... 257/43, 703, 700, 257/629, 705; 219/444.1, 544, 553; 118/724–725; 29/599

(56) References Cited

U.S. PATENT DOCUMENTS

| | | | |
|---|---|---|---|
| 4,517,584 A | * 5/1985 | Matsushita et al. | 257/705 |
| 4,555,358 A | * 11/1985 | Matsushita et al. | 252/516 |
| 4,764,435 A | * 8/1988 | Hosizaki et al. | 428/621 |
| 5,001,087 A | * 3/1991 | Kubota et al. | 501/17 |
| 5,082,163 A | * 1/1992 | Kanahara et al. | 228/124.1 |
| 5,264,681 A | * 11/1993 | Nozaki et al. | 219/544 |
| 5,294,574 A | * 3/1994 | Riedel et al. | 501/88 |
| 5,310,453 A | * 5/1994 | Fukasawa et al. | 438/716 |
| 5,408,574 A | * 4/1995 | Deevi et al. | 392/404 |
| 5,473,137 A | * 12/1995 | Queriaud et al. | 219/121.64 |

(Continued)

FOREIGN PATENT DOCUMENTS

| | | |
|---|---|---|
| JP | 3-255625 | 11/1991 |
| JP | 5-8140 | 1/1993 |
| JP | 6-48837 | 2/1994 |
| JP | 7-94576 | 4/1995 |
| JP | 8-133840 | 5/1996 |
| JP | 9-165264 | 6/1997 |
| JP | 9-283608 | 10/1997 |
| JP | 10-275524 | 10/1998 |
| JP | 10-279359 | 10/1998 |
| JP | 11-67886 | 3/1999 |
| JP | 11-100270 | 4/1999 |
| JP | 11-168134 | 6/1999 |
| JP | 2000-143349 | 5/2000 |

*Primary Examiner*—Amir Zarabian
*Assistant Examiner*—Ida M. Soward
(74) *Attorney, Agent, or Firm*—Oblon, Spivak, McClelland, Maier & Neustadt, P.C.

(57) ABSTRACT

The present invention provides a ceramic substrate which can keep a sufficiently large breakdown voltage even if the pore diameter of its maximum pore is 50 μm or less to be larger than that of conventional ceramic substrates, can give a large fracture toughness value because of the presence of pores, can resist thermal impact, and can give a small warp amount at high temperature. The ceramic substrate of the present invention is a ceramic substrate for a semiconductor-producing/examining device having a conductor formed on a surface of the ceramic substrate or inside the ceramic substrate, wherein: the substrate is made of a non-oxide ceramic containing oxygen; and the pore diameter of the maximum pore thereof is 50 μm or less.

14 Claims, 9 Drawing Sheets

U.S. PATENT DOCUMENTS

| | | | | |
|---|---|---|---|---|
| 5,492,730 A | * | 2/1996 | Balaba et al. | 427/387 |
| 5,563,764 A | * | 10/1996 | Arakawa et al. | 361/304 |
| 5,582,215 A | * | 12/1996 | Yamamoto et al. | 140/105 |
| 5,756,215 A | * | 5/1998 | Sawamura et al. | 428/446 |
| 5,843,589 A | * | 12/1998 | Hoshiya et al. | 428/692 |
| 5,880,439 A | * | 3/1999 | Deevi et al. | 219/535 |
| 5,965,193 A | * | 10/1999 | Ning et al. | 427/126.4 |
| 5,998,321 A | | 12/1999 | Katsuda et al. | |
| 6,025,579 A | * | 2/2000 | Tanaka et al. | 219/544 |
| 6,086,990 A | * | 7/2000 | Sumino et al. | 428/336 |
| 6,107,638 A | * | 8/2000 | Sumino et al. | 257/43 |
| 6,176,140 B1 | * | 1/2001 | Autenrieth et al. | 73/824 |
| 6,182,340 B1 | * | 2/2001 | Bishop | 29/25.35 |
| 6,183,875 B1 | * | 2/2001 | Ning et al. | 428/472 |
| 6,272,002 B1 | | 8/2001 | Mogi et al. | |
| 6,465,763 B1 | | 10/2002 | Ito et al. | |
| 6,475,606 B2 | | 11/2002 | Niwa | |
| 6,507,006 B1 | | 1/2003 | Hiramatsu et al. | |
| 2002/0010073 A1 | * | 1/2002 | Beall et al. | 501/128 |

* cited by examiner

US 6,891,263 B2

CERAMIC SUBSTRATE FOR A SEMICONDUCTOR PRODUCTION/INSPECTION DEVICE

FIELD OF THE INVENTION

The present invention relates to a ceramic substrate for a semiconductor-producing/examining device, used mainly in the semiconductor industry, particularly to a ceramic substrate which has a high breakdown voltage, is superior in the capability of absorbing a silicon wafer when used as an electrostatic chuck, and is also superior in temperature-rising and temperature-falling property when used as a hot plate (ceramic heater) or a ceramic plate for a wafer prober.

BACKGROUND ART

Semiconductors are very important products necessary in various industries. A semiconductor chip is produced, for example, by slicing a silicon monocrystal into a given thickness to produce a silicon wafer, and then forming plural integrated circuits and the like on this silicon wafer.

In the process for producing this semiconductor chip, a silicon wafer put on an electrostatic chuck is subjected to various treatments such as etching and CVD to form a conductor circuit, an element and the like. At this time, corrosive gas such as gas for deposition or gas for etching is used; therefore, it is necessary to protect an electrostatic electrode layer from corrosion by the gas. Also, since it is necessary to induce adsorption power, the electrostatic electrode layer is usually coated with a ceramic dielectric film and the like.

SUMMARY OF THE INVENTION

As this ceramic dielectric film, a nitride ceramic has been conventionally used. Hitherto, however, the dielectric film has been formed by sintering without addition of an oxide and the like. Therefore, almost all of pores made inside the dielectric film interconnect with each other, and the number of open pores is also large. If such pores are present and the volume resistivity of the dielectric layer decreases at high temperature, electrons easily fly or jump over the air in the pores by application of a voltage so that the so-called spark is caused. Therefore, unless the pore diameter of the maximum pore is made small, there remains a problem that the sufficient breakdown voltage of the ceramic dielectric film cannot be easily kept at a high level.

For example, JP Kokai Hei 5-8140 discloses an electrostatic chuck, using a nitride whose pore diameter is made very small so that the pore diameter of the maximum pore is made to 5 $\mu$m or less.

It has been found out that such a problem is caused in not only an electrostatic chuck but also a ceramic substrate for a semiconductor-producing/examining device, wherein a conductor is formed on a surface of the ceramic substrate or inside the ceramic substrate.

As a result of eager investigation for solving the above-mentioned problem, the inventors have newly found out that by adding an oxide to a nitride ceramic and firing the resultant product, sintering can be advanced so that interconnecting pores are not practically generated and independent pores are formed, and that by incorporating the oxide into boundaries between particles of the ceramic, a sufficient breakdown voltage at high temperature can be ensured even if the diameter of the pores is large.

That is, the present invention is a ceramic substrate for a semiconductor-producing/examining device having a conductor formed on a surface of the ceramic substrate or inside the ceramic substrate, wherein:
the substrate is made of a non-oxide ceramic containing oxygen; and
the pore diameter of the maximum pore thereof is 50 $\mu$m or less.

The non-oxide ceramic is preferably a nitride ceramic or a carbide ceramic.

The ceramic substrate preferably contains oxygen in an amount of 0.05 to 10% by weight.

The ceramic substrate preferably has a porosity of 5% or less.

The ceramic substrate is preferably used within the temperature range of 100 to 700° C.

The ceramic substrate preferably has a thickness of 25 mm or less, and a diameter of 200 mm or more.

The ceramic substrate preferably has a plurality of through holes into which lifter pins for a semiconductor wafer will be inserted.

Figure 1:
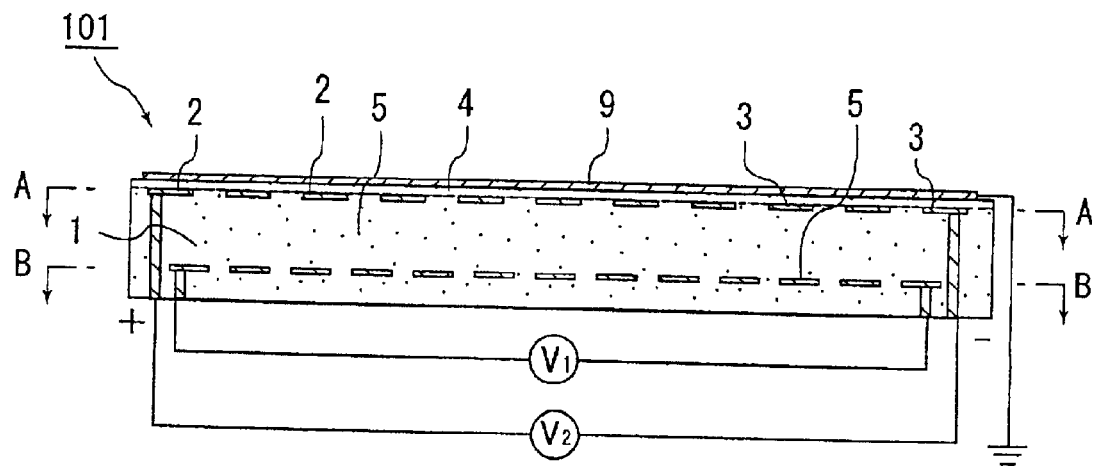
FIG. 1 is a sectional view that schematically illustrates one example of an electrostatic chuck according to the present invention.

EXPLANATION OF SYMBOLS 101, 201, 301, 401 electrostatic chuck
1 ceramic substrate
2, 22, 32a, 32b chuck positive electrostatic layer
3, 23, 33a, 33b chuck negative electrostatic layer
2a, 3a semicircular part 2b, 3b comb-teeth-shaped part
4 ceramic dielectric film
5 resistance heating element
6, 18 external terminal pin
7 metal wire
8 Peltier device
9 silicon wafer
11 bottomed hole
12 through hole
13, 14 blind hole
15 resistance heating element
150 metal layer
16, 17 conductor-filled through hole
41 supporting case
42 coolant outlet
43 inhalation duct
44 coolant inlet
45 heat insulator

DETAILED DISCLOSURE OF THE INVENTION

The ceramic substrate for a semiconductor-producing/examining device of the present invention is a ceramic substrate for a semiconductor-producing/examining device having a conductor formed on a surface of the ceramic substrate or inside the ceramic substrate, wherein:

the substrate is made of a non-oxide ceramic containing oxygen; and the pore diameter of the maximum pore thereof is 50 μm or less.

In the ceramic substrate of the present invention, pores are not present at all or, if pores are present, the pore diameter of the maximum pore thereof is 50 μm or less.

In the case that no pores are present, the breakdown voltage at high temperature is particularly high. Conversely, if pores are present, the fracture toughness value becomes high. Therefore, which design is selected is decided under the consideration of required properties.

The reason why the fracture toughness value becomes high by the presence of the pores is unclear, but it is presumed that the development of cracks is stopped by the pores.

In the ceramic substrate of the present invention, it is preferred to use: a nitride ceramic or a carbide ceramic, which are containing oxygen. By incorporating oxygen, sintering can be advanced and interconnecting pores are not practically generated. Thus, independent pores are formed. Therefore, corrosive gas does not erode the conductor. Electrons do not easily fly or jump inside the pores in the case of the independent pores compared to the case of interconnecting pores.

Furthermore, by incorporating the oxide into the boundaries between particles of the ceramic, a sufficient breakdown voltage at high temperature can be ensured even if the pore diameter becomes large.

In the ceramic substrate of the present invention, it is necessary that the pore diameter of the maximum pore is 50 μm or less. If the pore diameter of the maximum pore is over 50 μm, high breakdown voltage property cannot be ensured at 100 to 700° C., particularly high temperatures of 200° C. or higher.

The pore diameter of the maximum pore is desirably 10 μm or less. This is because a warp amount at 100 to 700° C., particularly at 200° C. or higher, becomes small.

The porosity and the pore diameter of the maximum pore are adjusted by pressing time, pressure and temperature at the time of sintering. However, for nitride ceramics, they are adjusted by additives such as SiC and BN. Since SiC or BN obstructs sintering, pores can be introduced.

At the measurement of the pore diameter of the maximum pore, 5 samples are prepared. The surfaces thereof are ground into mirror planes. With an electron microscope, ten points on the surface are photographed with 2000 to 5000 magnifications. The maximum pore diameters are selected from the photos obtained by the photographing, and the average of the 50 shots is defined as the pore diameter of the maximum pore.

The ceramic substrate desirably contains oxygen in an amount of 0.05 to 10% by weight, and particularly desirably in an amount of 0.1 to 5% by weight. If the amount thereof is below 0.1% by weight, the sufficient breakdown voltage may not be maintained. Conversely, if the amount is over 5% by weight, the high breakdown voltage property of the oxide at high temperature becomes poor so that the breakdown voltage of the ceramic substrate may drop, as well. If the oxygen amount is over 5% by weight, the thermal conductivity may drop so that the temperature-rising and temperature-falling property may becomes poor.

In the ceramic substrate, the porosity thereof is desirably 5% or less. If the porosity is over 5%, the number of the pores increases and the pore diameter of the pores becomes too large. As a result, the pores interconnect easily with each other so that the breakdown voltage drops.

The porosity is measured by Archimedes' method. According to this method, a sintered product is crushed into pieces, and the crushed pieces are put into an organic solvent or mercury to measure the volume thereof. Then the true specific gravity of the pieces is obtained from the weight and the measured volume thereof, and the porosity is calculated from the true specific gravity and apparent specific gravity.

The ceramic substrate is desirably used within the temperature range of 100 to 700° C. Within such a temperature range, the breakdown voltage drops. Thus, the structure of the present invention is especially profitable.

In the ceramic substrate, its warp amount at 100 to 700° C. is desirably small. This is because in the case that the ceramic substrate is used as a heater or an electrostatic chuck, a semiconductor wafer can be uniformly heated. In the case that the warp amount is large, the semiconductor wafer does not adhere closely to a heating surface of heater so that the semiconductor wafer cannot be uniformly heated. In this case, if the semiconductor wafer is heated in the manner that the semiconductor wafer and the heating surface are apart from each other, the distance between the semiconductor wafer and the heating surface becomes uneven so that the semiconductor wafer cannot be uniformly heated.

The warp amount in the case that the temperature of the ceramic substrate is raised up to 100 to 700° C. and then returned to ambient temperature (25° C.) (that is, the difference between the warp amounts before and after the temperature-rising) is desirably 7 μm or less.

The ceramic substrate of the present invention can be used to produce/examine a semiconductor, and can be used as an electrostatic chuck, a hot plate (ceramic heater), a ceramic plate for a wafer prober (which is referred to merely as a wafer prober, hereinafter), and the like.

The thickness of the ceramic substrate of the present invention is desirably 50 mm or less, and particularly desirably 25 mm or less. If the thickness of the ceramic substrate is over 25 mm, the thermal capacity of the ceramic substrate becomes large. Particularly when a temperature controlling means is set up to heat or cool the substrate, temperature-following property may become poor due to the large thermal capacity.

This is also because: the problem about the warp resulting from the presence of the pores, which is to be solved by the ceramic substrate of the present invention, is not practically caused in thick ceramic substrates having a thickness of more than 25 mm. Particularly, 5 mm or less is optimal. Incidentally, the thickness is desirably 1 mm or more.

The diameter of the ceramic substrate of the present invention is desirably 200 mm or more. It is particularly desirable that the diameter is 12 inches (300 mm) or more. This is because such semiconductor wafers will become main currents of the next-generation silicon wafers. This is also because a problem about warp at high temperature ranges, which is to be solved by the present invention, is not practically caused in the ceramic substrate having a diameter of 200 mm or less.

The ceramic substrate desirably has a plurality of through holes into which lifter pins for a semiconductor wafer will be inserted. With the presence of the through holes, strain at the time of processing is released in the case that Young's modulus is lowered particularly at high temperature. As a result, warp is easily generated. It can be considered that this is a structure for which the present invention exhibits the best advantageous effect.

Examples of the nitride ceramic constituting the ceramic substrate of the present invention include metal nitride ceramics, such as aluminum nitride, silicon nitride, boron nitride and titanium nitride.

In the ceramic substrate of the present invention, it is desired that the ceramic substrate contains a sintering aid.

The sintering aid that can be used may be an alkali metal oxide, an alkali earth metal oxide or a rare earth element oxide. Among these sintering aids, $CaO$, $Y_2O_3$, $Na_2O$, $Li_2O$ and $Rb_2O$ are particularly preferred. Alumina may be used. The content of these sintering aids is desirably from 0.1 to 20% by weight.

In the ceramic substrate of the present invention, the ceramic substrate desirably contains 5 to 5000 ppm of carbon.

The ceramic substrate can be blackened by incorporating carbon. Thus, when the substrate is used as a heater, radiant heat can be sufficiently used.

Carbon may be amorphous or crystalline. When amorphous carbon is used, a drop in the volume resistivity at high temperature can be prevented. When crystalline carbon is used, a drop in the thermal conductivity at high temperature can be prevented. Therefore, crystalline carbon and amorphous carbon may be used together dependently on the purpose. The carbon content is preferably from 50 to 2000 ppm.

When carbon is contained in the ceramic substrate, carbon is preferably contained in the manner that its brightness will be N6 or less as a value based on the rule of JIS Z 8721. The ceramic having such a brightness is superior in radiant heat capacity and covering-up property.

The brightness N is defined as follows: the brightness of ideal black is made to 0; that of ideal white is made to 10; respective colors are divided into 10 parts in the manner that the brightness of the respective colors is recognized stepwise between the brightness of black and that of white at equal intensity intervals; and the resultant parts are indicated by symbols N0 to N10, respectively.

Actual brightness is measured by comparison with color chips corresponding to N0 to N10. One place of decimals in this case is made to 0 or 5.

In the ceramic substrate of the present invention, a silicon wafer is put on a wafer-putting surface of the ceramic substrate in the state that they contact each other. Besides, the silicon wafer may be supported by lifter pins and the like and held in the state that a given interval is kept between the silicon wafer and the ceramic substrate, as illustrated in FIG. 13.

Figure 13:
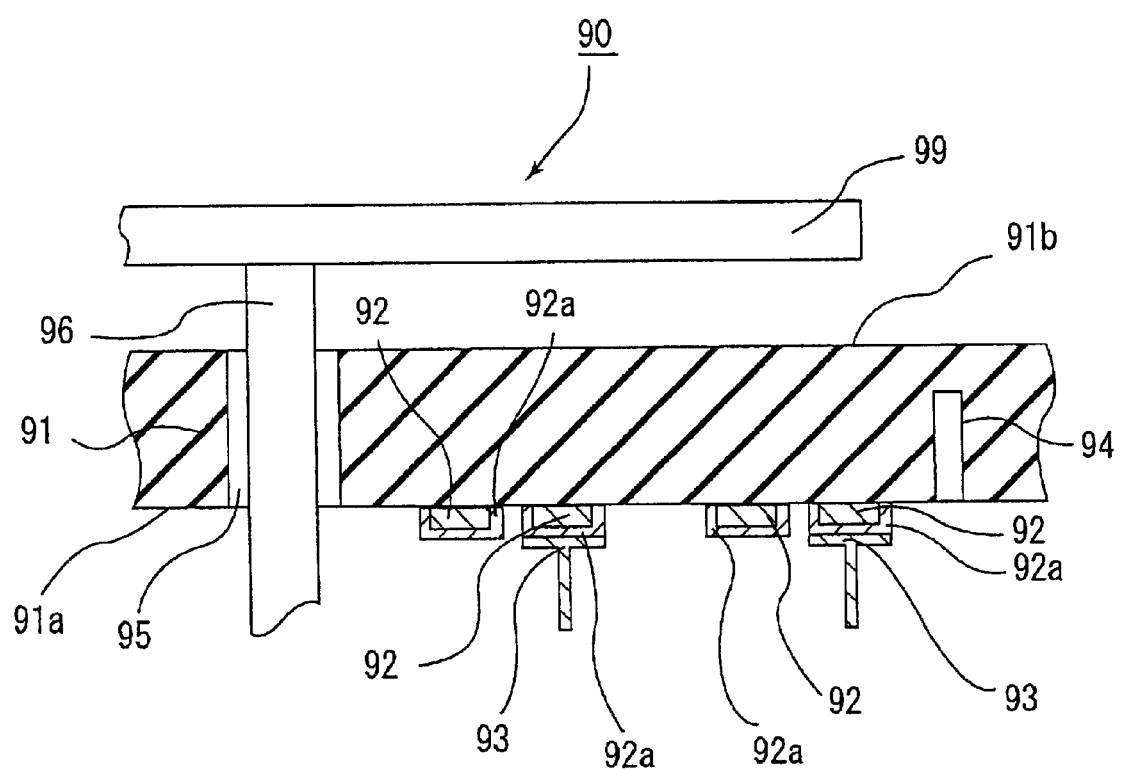
FIG. 13 is a sectional view that schematically illustrates a hot plate according to the present invention.

FIG. 13 is a partially enlarged sectional view that schematically illustrates a ceramic heater, which is an example of the ceramic substrate of the present invention.

In FIG. 13, lifter pins 96 are inserted into through holes 95 to support a silicon wafer 99. By moving the lifter pins 96 up and down, it is possible to receive the silicon wafer 99 from a carrier machine, put the silicon wafer 99 on a ceramic substrate 91, or heat the silicon wafer 99 in the state that the silicon wafer 99 is supported. Heating elements 92 are formed on a bottom surface 91a of the ceramic substrate 91, and metal covering layers 92a are deposited on the surface of the heating elements 92. A bottomed hole 94 is also made. A thermocouple is inserted therein.

The silicon wafer 99 is heated on the side of a wafer-heating surface 91b.

In the case that a ceramic substrate for a semiconductor-producing/examining device of the present invention is used as a ceramic heater, a semiconductor wafer and the heating-surface can be kept away from each other. The separation distance therebetween is desirably 50 to 5000 $\mu$m. The present invention is particularly profitable for the case that such separation is present. This is because the warp amount of the ceramic substrate at high temperature is small so that the distance between the semiconductor wafer and the heating-surface becomes uniform.

In the case that the ceramic substrate of the present invention is used as a hot plate (ceramic heater), the conductor is a heating element, and may be a metal layer with the thickness of about 0.1 to 100 $\mu$m or may be a heating wire. In the case that the ceramic substrate is used as an electrostatic chuck, the conductor is an electrostatic electrode, and an RF electrode or a heating element may be formed as a conductor: below the electrostatic electrode and inside the ceramic substrate. In the case that the ceramic substrate is used as a wafer prober, a chuck top conductor layer is formed as a conductor on the surface and guard electrodes, and ground electrodes are formed as conductors inside.

The ceramic substrate of the present invention is desirably used at 100° C. or higher, optimally 200° C. or higher.

The following will describe the present invention, giving: an electrostatic chuck and a wafer prober, which have a function as a hot plate, as examples.

In an electrostatic chuck according to the present invention, electrostatic electrodes are formed on a ceramic substrate. A ceramic dielectric film covering the electrostatic electrodes is made of a non-oxide ceramic, such as a nitride ceramic or a carbide ceramic, containing oxygen. Its porosity is 5% or less, and the pore diameter of its maximum pore is 50 $\mu$m or less. Therefore, the pores in this dielectric film are composed of pores independently on each other. Accordingly, it does not happen that gas and so on which cause a drop in the breakdown voltage penetrate through the ceramic dielectric film to corrode the electrostatic electrode and lower the breakdown voltage of the ceramic dielectric film even at high temperature.

By setting the thickness of the ceramic dielectric film to 50 to 5000 $\mu$m, a sufficient breakdown voltage can be ensured without lowering chucking power.

Figure 2:
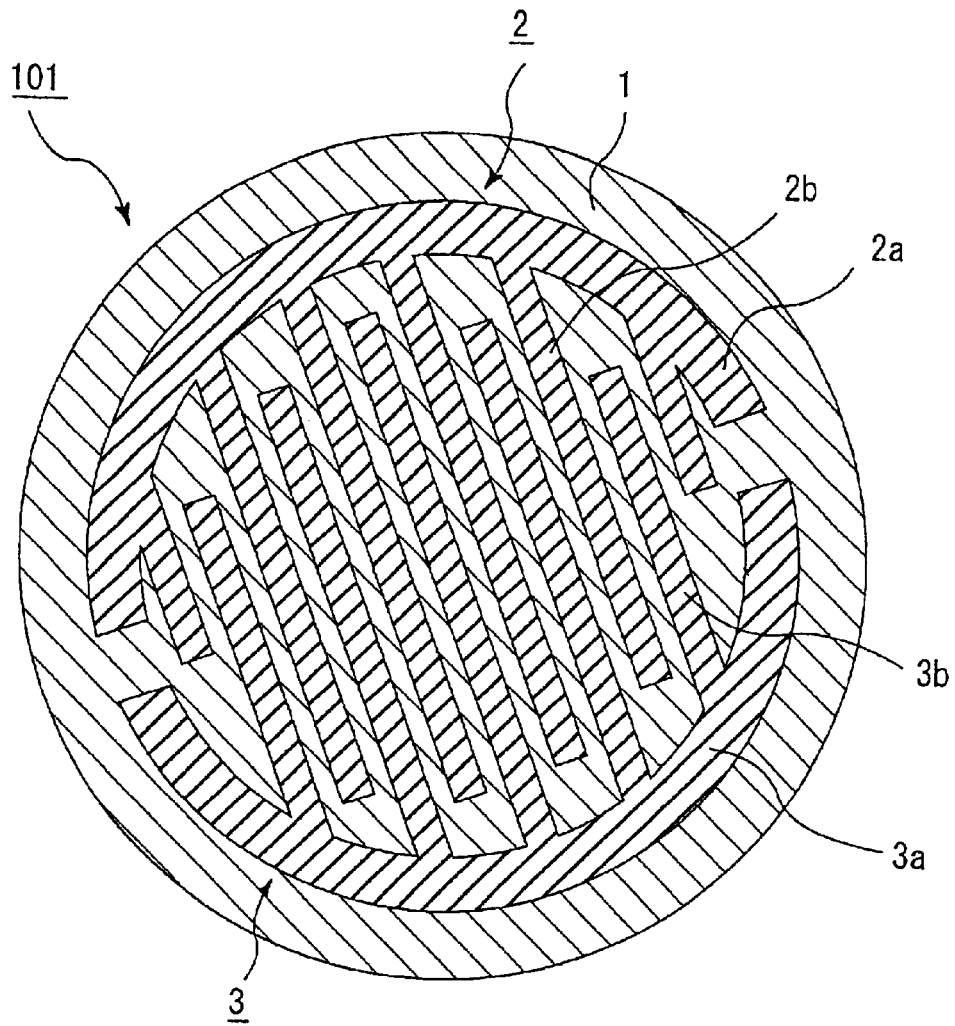
FIG. 2 is a sectional view taken along A—A line of the electrostatic chuck illustrated in FIG. 1.
Figure 3:
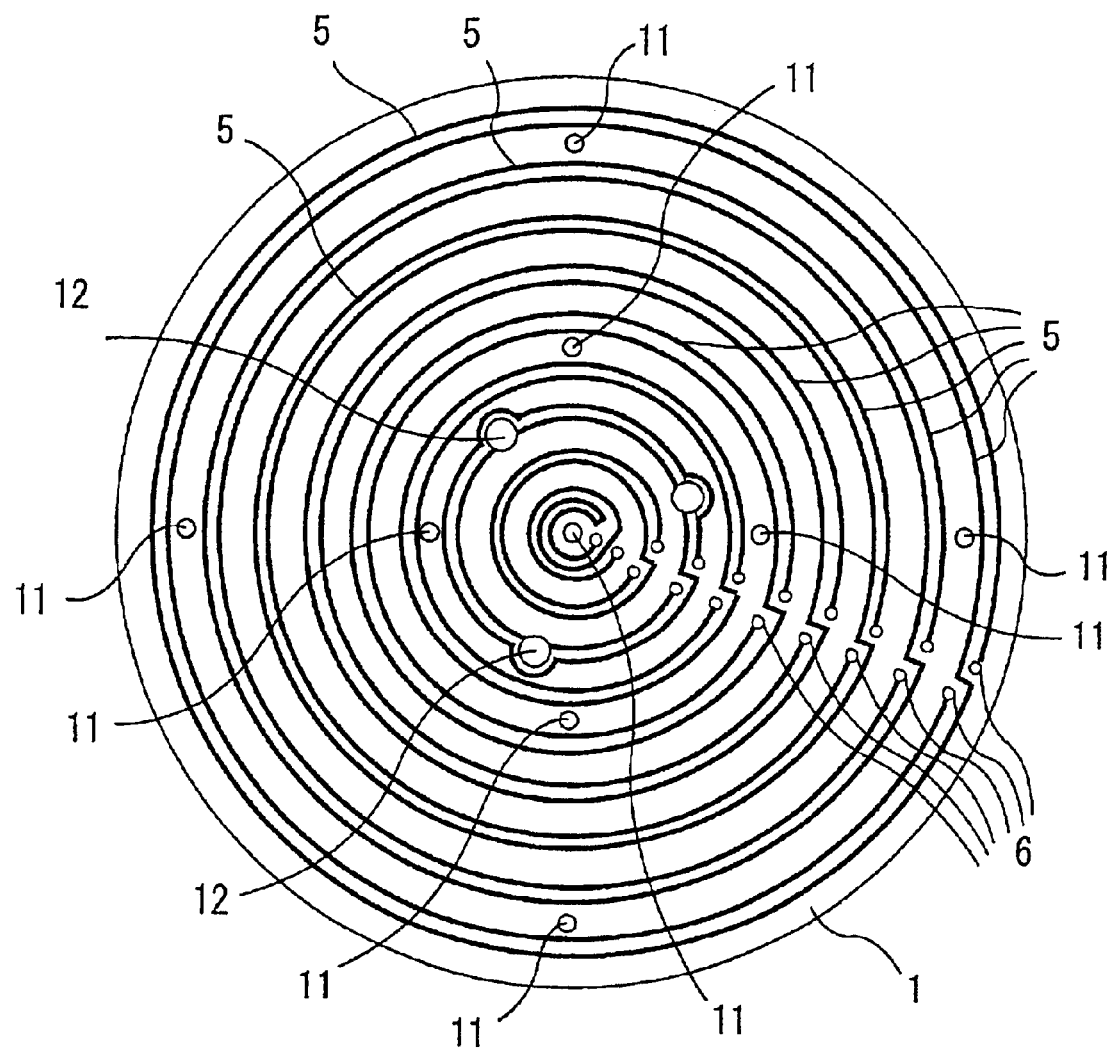
FIG. 3 is a sectional view taken along B—B line of the electrostatic chuck illustrated in FIG. 1.

FIG. 1 is a vertical sectional view that schematically shows an electrostatic chuck which is an embodiment of the ceramic substrate of the present invention. FIG. 2 is a sectional view taken on A—A line of the electrostatic chuck shown in FIG. 1. FIG. 3 is a sectional view taken along B—B line of the electrostatic chuck shown in FIG. 1.

In this electrostatic chuck 101, an electrostatic electrode layer composed of a chuck positive electrostatic layer 2 and a chuck negative electrostatic layer 3 is formed on the surface of a ceramic substrate 1 in a circular form as viewed from the above. A ceramic dielectric film 4 made of a nitride ceramic containing oxygen is formed to cover this electrostatic electrode layer. A silicon wafer 9 is put on the electrostatic chuck 101 and is grounded.

As shown in FIG. 2, the chuck positive electrostatic layer 2 is composed of a semicircular part 2a and a comb-teeth-shaped part 2b. The chuck negative electrostatic layer 3 is also composed of a semicircular part 3a and a comb-teeth-shaped part 3b. These chuck positive electrostatic layer 2 and chuck negative electrostatic layer 3 are arranged opposite to each other so that the comb-teeth-shaped parts 2b and 3b cross each other. The + side and the − side of a direct power source are connected to the chuck positive electrostatic layer 2 and chuck negative electrostatic layer 3, respectively. Thus, a direct current $V_2$ is applied thereto.

In order to control the temperature of the silicon wafer 9, resistance heating elements 5 in the form of concentric circles as viewed from the above, as shown in FIG. 3, are set up inside the ceramic substrate 1. External terminal pins 6 are connected and fixed to both ends of the resistance heating elements 5, and a voltage $V_1$ is applied thereto. Bottomed holes 11 into which temperature-measuring elements will be inserted and through holes 12 through which lifter pins (not illustrated) that support the silicon wafer 9 and move it up and down penetrate, are formed in the ceramic substrate 1, as shown in FIG. 3 but not shown in FIGS. 1, 2. The resistance heating elements 5 may be formed on the bottom surface of the ceramic substrate. When this electrostatic chuck 101 is caused to work, a direct voltage $V_2$ is applied to the chuck positive electrostatic layer 2 and the chuck negative electrostatic layer 3. In this way, the silicon wafer 9 is adsorbed and fixed to the chuck positive electrostatic layer 2 and the chuck negative electrostatic layer 3 through the ceramic dielectric film 4 by electrostatic action of these electrodes. The silicon wafer 9 is fixed onto the electrostatic chuck 101 in this way, and subsequently the silicon wafer 9 is subjected to various treatments such as CVD.

The electrostatic chuck according to the present invention has a structure as illustrated in FIGS. 1 to 3. The following will successively describe the respective members of the above-mentioned electrostatic chuck and other embodiments of the electrostatic chuck according to the present invention in detail.

The ceramic dielectric film used in the electrostatic chuck according to the present invention preferably made of a nitride ceramic containing oxygen, and the pore diameter of its maximum pore is 50 $\mu$m or less. Its thickness is preferably 50 to 1500 $\mu$m, and its porosity is 5% or less.

Examples of the nitride ceramic include metal nitride ceramics, such as aluminum nitride, silicon nitride, boron nitride and titanium nitride. Among these nitride ceramics, aluminum nitride is most preferred. This is because its breakdown voltage is high and its thermal conductivity is highest, that is, 180 W/m·K.

The nitride ceramic contains oxygen. For this reason, the sintering of the nitride ceramic advances easily. Thus, even if pores are contained therein, the pores become independent on each other. Therefore, the breakdown voltage is improved for the above-mentioned reason.

Usually, raw material powder of the nitride ceramic is heated in oxygen or in the air, or the raw material powder of the nitride ceramic is mixed with a metal oxide and then the mixture is fired, in order to incorporate oxygen into the nitride ceramic.

Examples of the metal oxide include yttria ($Y_2O_3$), alumina ($Al_2O_3$), rubidium oxide ($Rb_2O$), lithium oxide ($Li_2O$), and calcium oxide ($CaCO_3$).

The added amount of these metal oxides is preferably 0.1 to 10 parts by weight per 100 parts by weight of the nitride ceramic.

The porosity of the ceramic dielectric film is desirably 5% or less. It is also desirable that its thickness is 50 to 5000 $\mu$m and the pore diameter of its maximum pore is 50 $\mu$m or less.

If the thickness of the ceramic dielectric film is below 50 $\mu$m, the film thickness is too thin to obtain sufficient breakdown voltage. Thus, when a silicon wafer is put on the film and is adsorbed thereon, the ceramic dielectric film may undergo dielectric breakdown. On the other hand, if the thickness of the ceramic dielectric film is over 5000 $\mu$m, the distance between the silicon wafer and the electrostatic electrodes becomes large so that the capability of adsorbing the silicon wafer becomes poor. The thickness of the ceramic dielectric film is more preferably 100 to 1500 $\mu$m.

If the porosity is over 5%, the number of the pores increases and the pore diameter becomes too large. As a result, the pores interconnect easily with each other. In the ceramic dielectric film having such a structure, the breakdown voltage drops.

If the pore diameter of the maximum pore is over 50 $\mu$m, the sufficient breakdown voltage cannot be maintained at high temperature even if the oxide is present in the boundaries between the particles. In the case that the pores are present, the porosity is more preferably 0.001 to 3% and the pore diameter of the maximum pore is more preferably 0.1 to 10 $\mu$m.

The ceramic dielectric film desirably contains 50 to 5000 ppm of carbon. This is because the electrode pattern set inside the electrostatic chuck can be hidden and high radiant heat can be obtained. As the volume resistivity is lower, the capability of adsorbing a silicon wafer becomes high at low temperature.

The reason why in the electrostatic chuck of the present invention a considerable number of the pores may be present in the ceramic dielectric film is that the pores can cause an improvement in the fracture toughness value and the resistance to thermal impact.

Examples of the electrostatic electrodes formed on the ceramic substrate include a sintered body of a metal or a conductive ceramic; and a metal foil. As the metal sintered body, at least one selected from tungsten and molybdenum is preferred. The metal foil is preferably made of the same material as the metal sintered body. These metals are not relatively liable to be oxidized and have a sufficient conductivity for electrodes. As the conductive ceramic, at least one selected from carbides of: tungsten; and molybdenum can be used.

Figure 8:
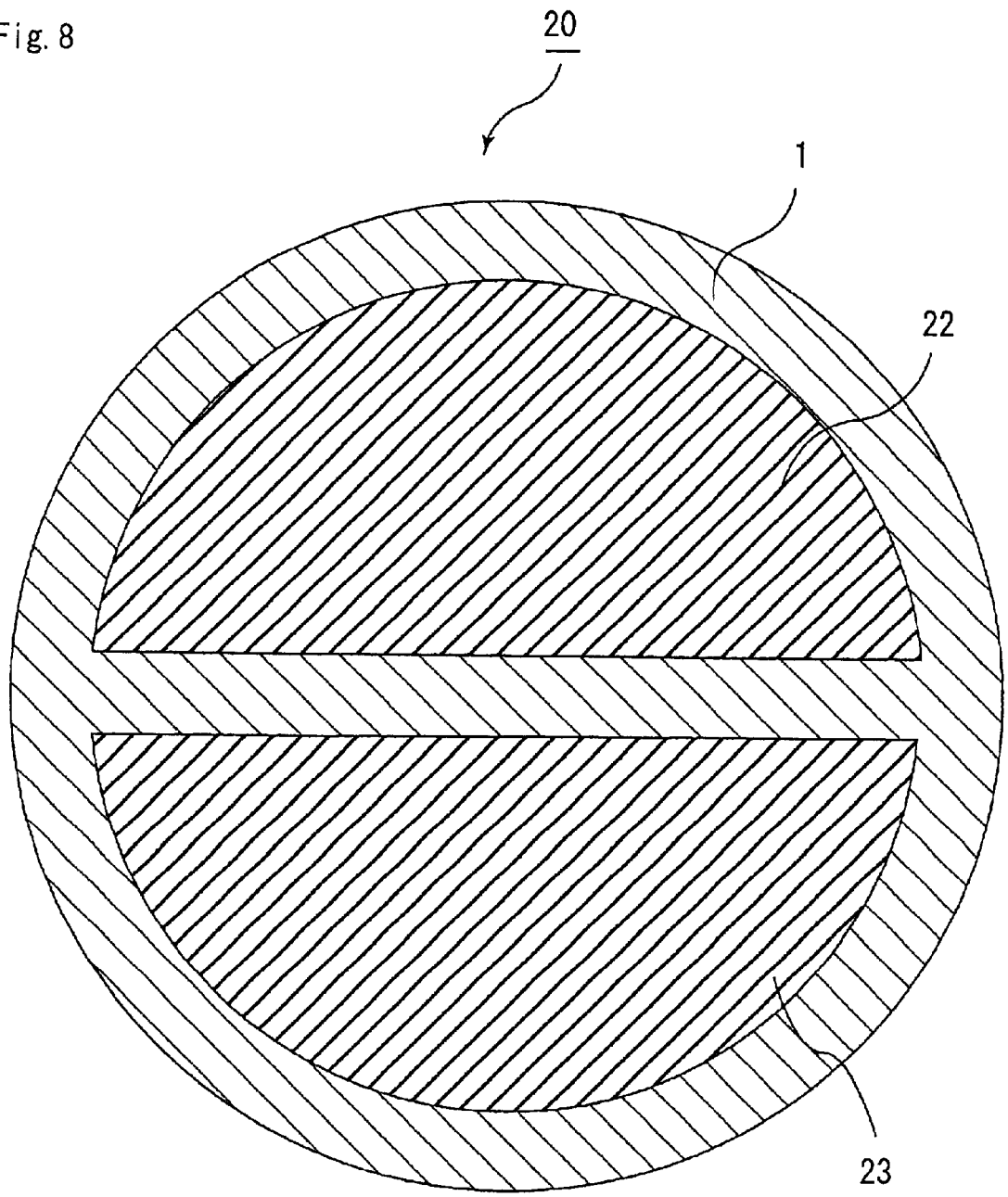
FIG. 8 is a horizontal sectional view that schematically illustrates a shape of an electrostatic electrode constituting an electrostatic chuck according to the present invention.
Figure 9:
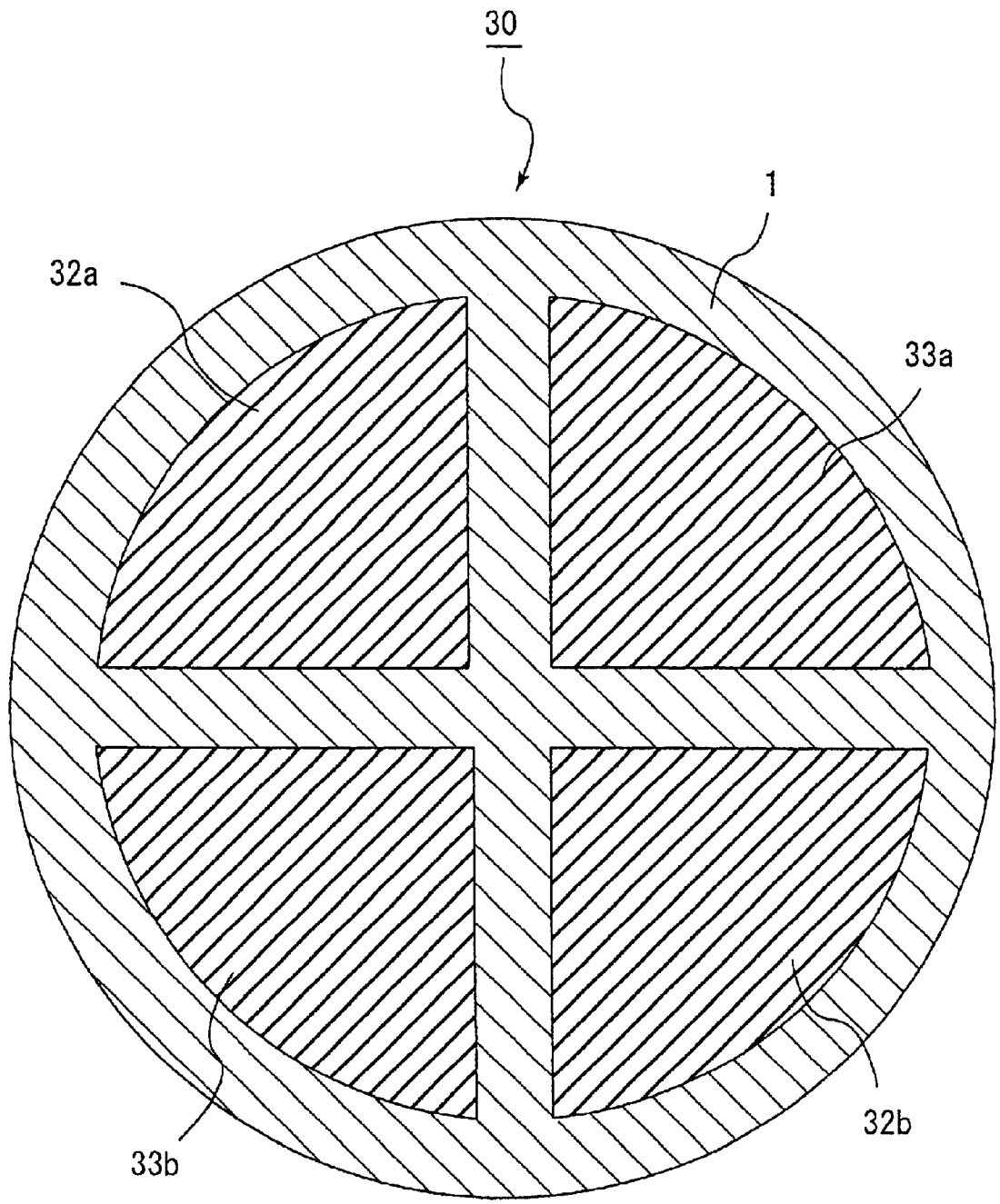
FIG. 9 is a horizontal sectional view that schematically illustrates a shape of an electrostatic electrode constituting an electrostatic chuck according to the present invention.

FIGS. 8, 9 are horizontal sectional views, each of which schematically shows an electrostatic electrode in another electrostatic chuck. In an electrostatic chuck 20 shown in FIG. 8, a chuck positive electrostatic layer 22 and a chuck negative electrostatic layer 23 in a semicircular form are formed inside a ceramic substrate 1. In an electrostatic chuck shown in FIG. 9, chuck positive electrostatic layers 32a and 32b and chuck negative electrostatic layers 33a and 33b, each of which has a shape obtained by dividing a circle into 4 parts, are formed inside a ceramic substrate 1. The two chuck positive electrostatic layers 22a and 22b and the two chuck negative electrostatic layers 33a and 33b are formed to cross, respectively.

In the case that an electrode having a form that an electrode in the shape of a circle or the like is divided is formed, the number of divided pieces is not particularly limited and may be 5 or more. Its shape is not limited to a fan-shape.

The ceramic substrate used in the electrostatic chuck according to the present invention is preferably made of nitride ceramic, or carbide ceramic.

Examples of the nitride ceramic include aluminum nitride, silicon nitride, boron nitride and titanium nitride.

Examples of the carbide ceramic include silicon carbide, boron carbide, titanium carbide, and tungsten carbide.

The ceramic dielectric film and the ceramic substrate are desirably made of the same material. This is because the nitride ceramic has a high thermal conductivity and can satisfactorily conduct heat generated in the resistance heating elements. This is also because in the case that the ceramic dielectric film and the ceramic substrate are made of the same material, the electrostatic chuck can easily be produced by laminating green sheets in the same manner and then firing the lamination under the same conditions.

Among the nitride ceramics, aluminum nitride is most preferred since its thermal conductivity is highest, that is, 180 W/m·K.

The ceramic substrate desirably contains 50 to 5000 ppm of carbon. This is because high radiant heat can be obtained. As the carbon, either of crystalline which can be detected by X-ray diffraction or amorphous which cannot be detected thereby may be used. Both of the crystalline and the amorphous may be used.

In the electrostatic chuck according to the present invention, a temperature controlling means such as a resistance heating element is usually set up, as illustrated in FIG. 1. This is because it is necessary to conduct CVD treatment and so on while heating of the silicon wafer put on the electrostatic chuck and so on, are performed.

The temperature controlling means may be a Peltier device (reference to FIG. 6) as well as the resistance heating element 5 illustrated in FIG. 3. The resistance heating element may be set up inside the ceramic substrate or may be set up on the bottom surface of the ceramic substrate. In the case that the resistance heating element is set up, an inlet for blowing a coolant, such as air, as cooling means may be made in a supporting case into which the electrostatic chuck is to be fitted.

A plurality of layers of the resistance heating elements may be set inside the ceramic substrate. In this case, the patterns of the respective layers may be formed to complement them mutually. The pattern, when being viewed from the heating surface, is desirably formed on any one of the layers. For example, a structure having a staggered arrangement is desirable.

Examples of the resistance heating element include a sintered body of a metal or a conductive ceramic; a metal foil; and a metal wire. As the metal sintered body, at least one selected from tungsten and molybdenum is preferred. This is because these metals are not relatively liable to be oxidized and have a sufficiently large resistivity to generate heat.

As the conductive ceramic, at least one selected from carbides of: tungsten; and molybdenum may be used.

In the case that the resistance heating element is formed on the bottom surface of the ceramic substrate, it is desired to use, as the metal sintered body, a noble metal (gold, silver, palladium or platinum), or nickel. Specifically, silver, silver-palladium and the like may be used.

As the metal particles used in the metal sintered body, spherical or scaly particles, or a mixture of spherical particles and scaly particles can be used.

A metal oxide may be added to the metal sintered body. The metal oxide is used in order to let the ceramic substrate closely adhere to particles of the metal. The reason why the adhesion between the ceramic substrate and the metal particles is improved by the metal oxide is unclear, but would be as follows: an oxide film is slightly formed on the surface of the metal particles and a noxide film is formed on the surface of the ceramic substrate in the case that the ceramic substrate is made of a non-oxide ceramic as well as an oxide ceramic. It can be therefore considered that these oxide films are sintered and integrated with each other, through the metal oxide, on the surface of the ceramic substrate so that the metal particles and the ceramic substrate adhere closely to each other.

A preferred example of the metal oxide is at least one selected from lead oxide, zinc oxide, silica, boron oxide ($B_2O_3$) alumina, yttria, and titania. These oxides make it possible to improve adhesiveness between the metal particles and the ceramic substrate without increasing the resistivity of the resistance heating element too much.

The amount of the metal oxide is desirably 0.1 part or more by weight and is below 10 parts by weight per 100 parts by weight of the metal particles. The use of the metal oxide within this range makes it possible to improve the adhesion between the metal particles and the ceramic substrate without making the resistivity large.

When the total amount of the metal oxides is set to 100 parts by weight, the weight ratio of lead oxide, zinc oxide, silica, boron oxide ($B_2O_3$), alumina, yttria and titania is as follows: lead oxide: 1 to 10, silica: 1 to 30, boron oxide: 5 to 50, zinc oxide: 20 to 70, alumina: 1 to 10, yttria: 1 to 50 and titania: 1 to 50. The ratio is preferably adjusted within the scope that the total amount of these oxides is not over 100 parts by weight. This is because in these ranges it is possible to improve adhesiveness to the ceramic substrate.

Figure 4:
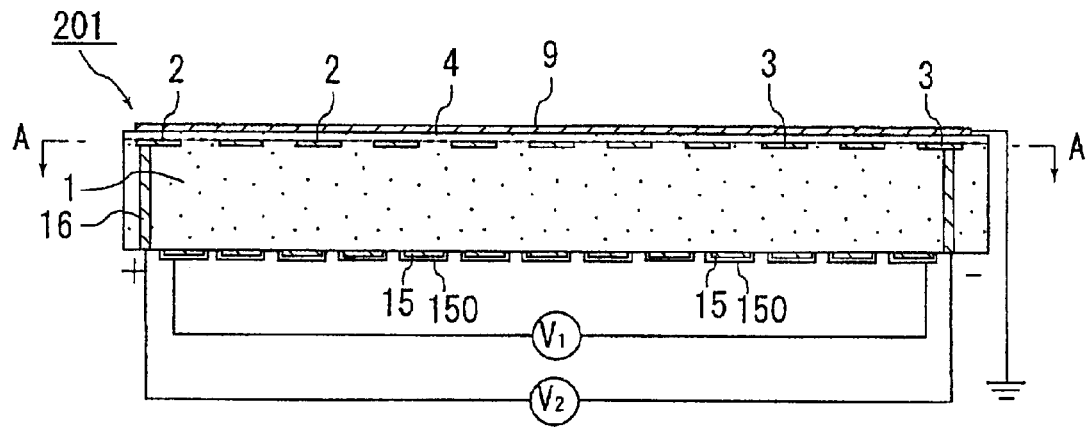
FIG. 4 is a sectional view that schematically illustrates one example of an electrostatic chuck according to the present invention.

In the case that the resistance heating element is set up on the bottom surface of the ceramic substrate, the surface of the resistance heating element 15 is desirably covered with a metal layer 150 (reference to FIG. 4). The resistance heating element 15 is a sintered body of the metal particles. Thus, when the resistance heating element 15 is exposed, it is easily oxidized. The oxidization causes a change in the resistivity. Thus, by covering the surface with the metal layer 150, the oxidization can be prevented.

The thickness of the metal layer 150 is desirably 0.1 to 10 $\mu$m. In this range, it is possible to prevent the oxidization of the resistance heating element without changing the resistivity of the resistance heating element.

The metal used for the covering is any non-oxidizable metal. Specifically, at least one selected from gold, silver, palladium, platinum and nickel is preferred. Among these metals, nickel is more preferred. This is because of the following: the resistance heating element needs to have a terminal for connection to a power source. This terminal is attached to the resistance heating element through solder. Nickel prevents thermal diffusion of the solder. As the connecting terminal, a terminal pin made of Kovar can be used.

In the case that the resistance heating element is inside the heater plate, the surface of the resistance heating element is not oxidized. Therefore, no covering is necessary. In the case that the resistance heating element is inside the heater plate, a part of the surface of the resistance heating element may be exposed.

As the metal foil used as the resistance heating element, a resistance heating element patterned by the etching of a nickel foil or a stainless steel foil and the like method is desirable.

The patterned metal foils may be put together with a resin film or the like.

Examples of the metal wire include a tungsten wire and a molybdenum wire.

In the case that the Peltier device is used as the temperature controlling means, both heating and cooling can be attained by changing the direction along which an electric current passes. Thus, this case is advantageous.

Figure 6:
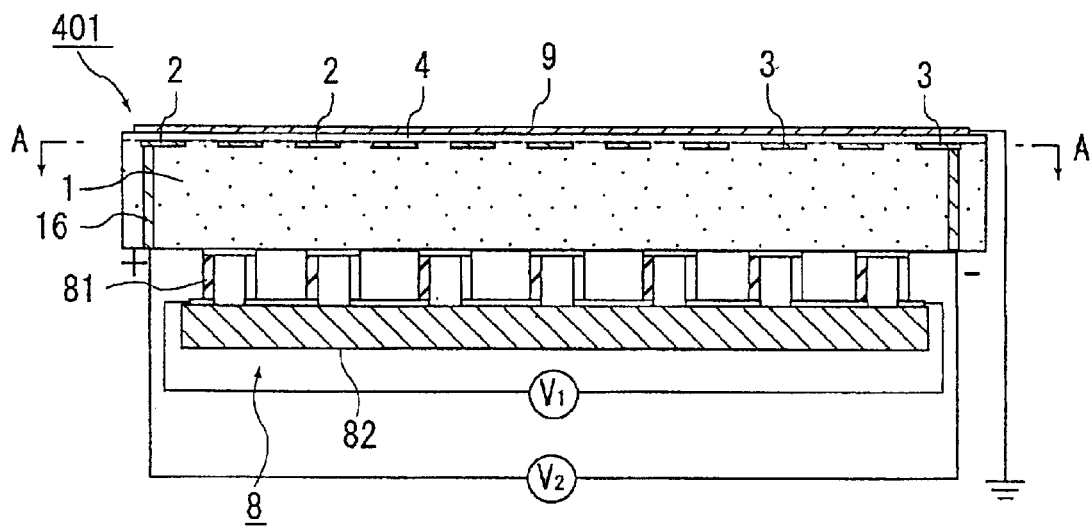
FIG. 6 is a sectional view that schematically illustrates one example of an electrostatic chuck according to the present invention.

As shown in FIG. 6, the Peltier device 8 is formed by connecting p type and n type thermoelectric elements 81 in series and then jointing the resultant to a ceramic plate 82.

Examples of the Peltier device include silicon/germanium, bismuth/antimony, and lead/tellurium materials.

Figure 5:
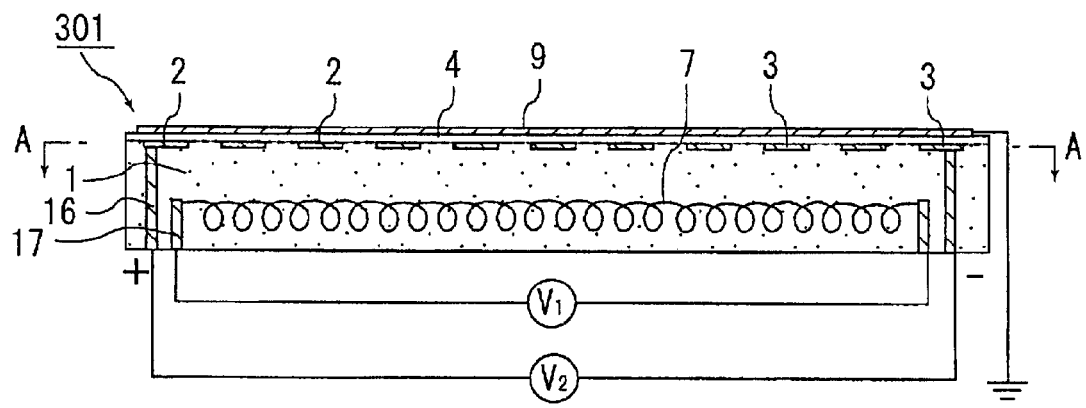
FIG. 5 is a sectional view that schematically illustrates one example of an electrostatic chuck according to the present invention.

Examples of the electrostatic chuck according to the present invention include: the electrostatic chuck 101 having a structure wherein the chuck positive electrostatic layer 2 and the chuck negative electrostatic layer 3 are arranged between the ceramic substrate 1 and the ceramic dielectric film 4 and the resistance heating elements 5 are set up inside the ceramic substrate 1, as shown in FIG. 1; the electrostatic chuck 201 having a structure wherein the chuck positive electrostatic layer 2 and the chuck negative electrostatic layer 3 are arranged between the ceramic substrate 1 and the ceramic dielectric film 4 and the resistance heating elements 15 are disposed on the bottom surface of the ceramic substrate 1, as shown in FIG. 4; the electrostatic chuck 301 having a structure wherein the chuck positive electrostatic layer 2 and the chuck negative electrostatic layer 3 are arranged between the ceramic substrate 1 and the ceramic dielectric film 4 and the metal wire 7, which is a resistance heating element, is embedded in the ceramic substrate 1, as shown in FIG. 5; and the electrostatic chuck 401 having a structure wherein the chuck positive electrostatic layer 2 and the chuck negative electrostatic layer 3 are arranged between the ceramic substrate 1 and the ceramic dielectric film 4 and the Peltier device 8 composed of the thermoelectric element 81 and the ceramic plate 82 is formed on the bottom surface of the ceramic substrate 1, as shown in FIG. 6.

As shown in FIGS. 1 to 6, in the electrostatic chuck according to the present invention the chuck positive electrostatic layer 2 and the chuck negative electrostatic layer 3 are arranged between the ceramic substrate 1 and the ceramic dielectric film 4 and the resistance heating element 5 or the metal wire 7 is formed inside the ceramic substrate 1. Therefore, connecting units (conductor-filled through holes) 16,17 are necessary for connecting these to external terminal pins. The conductor-filled through holes 16,17 are made by filling therein with a high melting point metal such as tungsten paste or molybdenum paste, or a conductive ceramic such as tungsten carbide or molybdenum carbide.

The diameter of the connecting units (conductor-filled through holes) 16,17 is desirably from 0.1 to 10 mm. This is because disconnection can be prevented and further cracks or strains can be prevented.

The conductor-filled through holes are used as connecting pads to connect external terminal pins 6,18 (reference to FIG. 7(d)).

The connecting thereof is performed with solder or brazing material. As the brazing material, brazing silver, brazing palladium, brazing aluminum, or brazing gold is used. Brazing gold is desirably Au—Ni alloy. Au—Ni alloy is superior in adhesiveness to tungsten.

The ratio of Au/Ni is desirably [81.5 to 82.5 (% by weight)]/[18.5 to 17.5 (% by weight)].

The thickness of the Au—Ni layer is desirably from 0.1 to 50 μm. This is because this range is a range sufficient for keeping connection. If Au—Cu alloy is used at a high temperature of 500 to 1000° C. and at a high vacuum of $10^{-6}$ to $10^{-5}$ Pa, the Au—Cu alloy deteriorates. However, Au—Ni alloy does not cause such a deterioration and is profitable. When the total amount of the Au—Ni alloy is regarded as 100 parts by weight, the amount of impurities therein is desirably below 1 part by weight.

If necessary, in the ceramic substrate of the present invention a thermocouple may be buried in the bottomed hole 11 in the ceramic substrate 1. This is because the thermocouple makes it possible to measure the temperature of the resistance heating element and, on the basis of the resultant data, voltage or electric current is changed so that the temperature can be controlled.

The size of the connecting portion of metal wires of the thermocouple is desirably the same as the original diameter of the respective metal wires or larger, and is preferably 0.5 mm or less. Such a structure makes the thermal capacity of the connecting portion small, and causes a temperature to be correctly and rapidly converted to a current value. For this reason, temperature controllability is improved so that the temperature distribution of the heated surface of the semiconductor wafer becomes small.

Examples of the thermocouple include K, R, B, S, E, J and T type thermocouples, described in JIS-C-1602 (1980).

Figure 10:
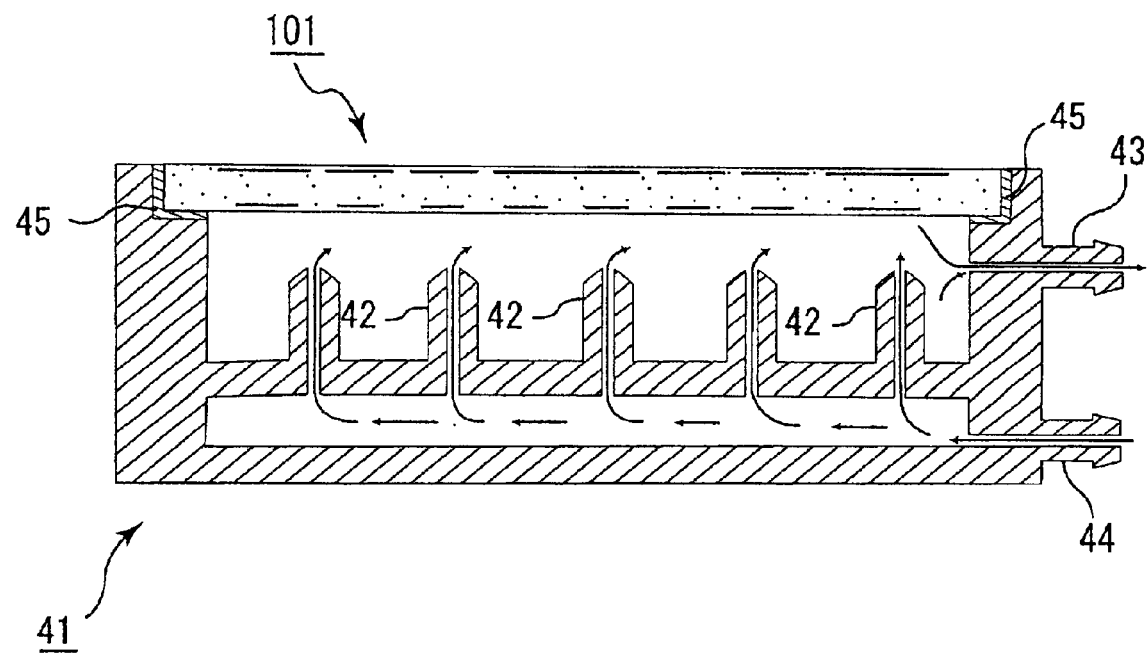
FIG. 10 is a sectional view that schematically illustrates the state that an electrostatic chuck according to the present invention is fitted into a supporting case.

FIG. 10 is a sectional view that schematically shows a supporting case 41 into which the electrostatic chuck of the present invention, having a structure as described above, is fitted.

The electrostatic chuck 101 is fitted into the supporting case 41 through a heat insulator 45. Coolant outlets 42 are formed in the supporting case 11, and a coolant is blown from a coolant inlet 44 and goes outside from an inhalation duct 43 after passing through the coolant outlet 42. By the act of this coolant, the electrostatic chuck 101 can be cooled.

Figure 7:
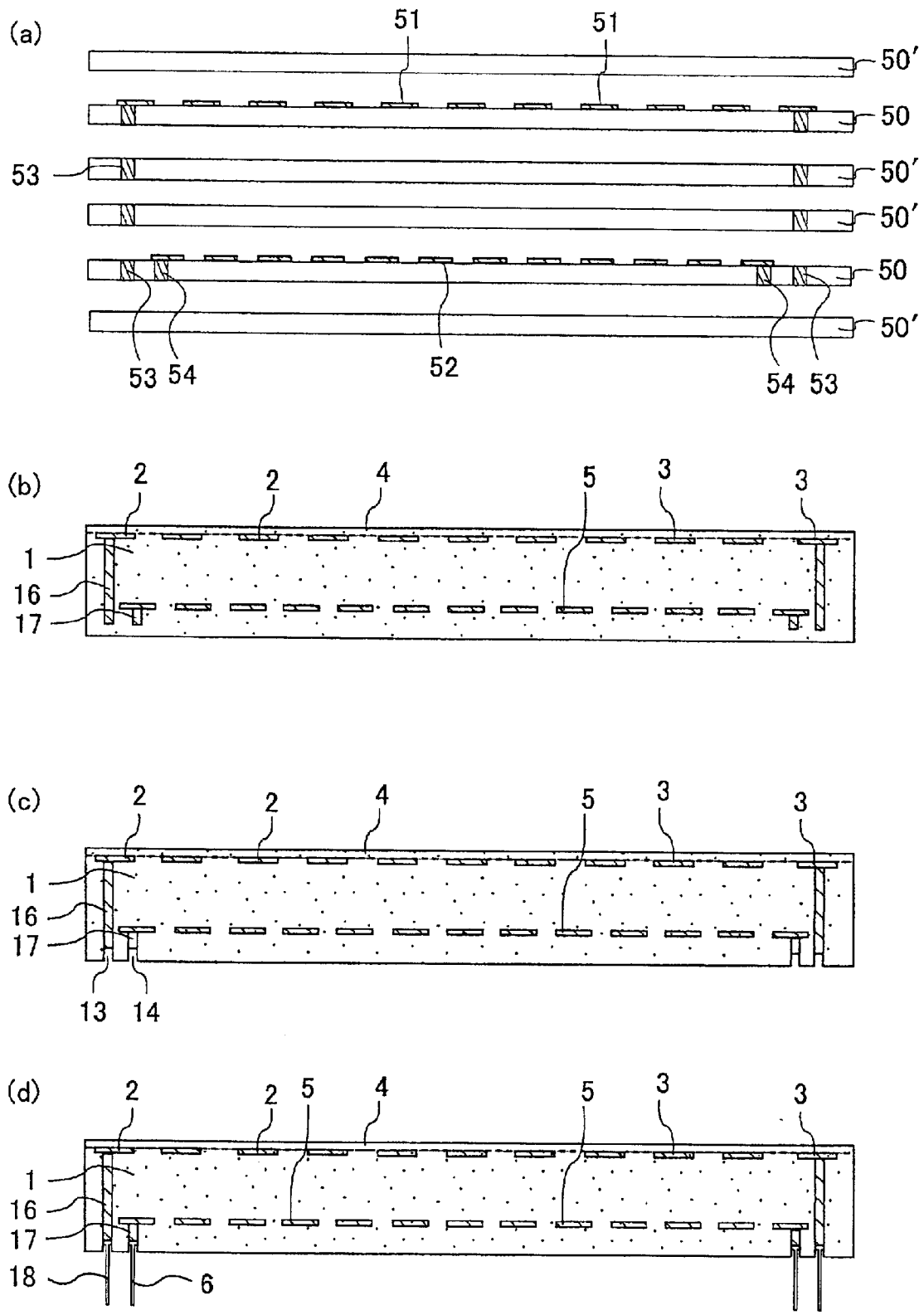
FIGS. 7(a) to (d) are sectional views that schematically illustrate a part of a process for producing an electrostatic chuck according to the present invention.

The following will describe one example of the process for producing an electrostatic chuck according to the present invention by referring to sections shown in FIGS. 7.

(1) First, ceramic powder of a nitride ceramic is mixed with a binder and a solvent to obtain a green sheet 50.

As the ceramic powder, there may be used, for example, aluminum nitride powder. If necessary, a sintering aid such as yttria may be added.

One or several green sheets 50' laminated on the green sheet on which an electrostatic electrode layer printed units 51 that will be described later are formed are layers which will be a ceramic dielectric film 4; therefore, the sheets 50' are made to be sheets wherein oxide powder is mixed with nitride powder.

Usually, the raw material of the ceramic dielectric film 4 and that of the ceramic substrate 1 are desirably the same. This is because, in many cases, these are sintered under the same condition since these are sintered as one body. In the case that the raw materials are different, it is allowable that a ceramic substrate is firstly produced, an electrostatic electrode layer is formed thereon and then a ceramic dielectric film is formed thereon.

As the binder, desirable is at least one selected from an acrylic binder, ethylcellulose, butylcellusolve, and polyvinyl alcohol.

As the solvent, desirable is at least one selected from α-terpineol and glycol.

A paste obtained by mixing these is formed into a sheet form by the doctor blade process. Thus, the green sheet 50 is obtained.

If necessary, a through hole into which a lifter pin of a silicon wafer is inserted, a concave portion in which the thermocouple is buried may be made in the green sheet 50. The through hole and concave portion can be made by punching and the like.

The thickness of the green sheet is preferably about from 0.1 to 5 mm.

Next, a conductor containing paste that will be electrostatic electrode layers and resistance heating elements is printed on the green sheet 50.

The printing is performed to obtain a desired aspect ratio, considering the shrinkage ratio of the green sheet 50. In this way, electrostatic electrode layer printed units 51 and resistance heating element layer printed units 52 are obtained.

The printed units are formed by printing a conductor containing paste containing conductive ceramic or metal particles, and the like.

As the conductive ceramic particles contained in the conductor containing paste, carbide of: tungsten; or molybdenum is optimal. This is because they are not practically oxidized and their thermal conductivity is not practically lowered.

As the metal particles, tungsten, molybdenum, platinum, nickel and the like can be used.

The average particle diameters of the conductive ceramic particles and the metal particles are preferably from 0.1 to 5 $\mu$m. This is because the conductor containing paste can not be practically printed in either case that these particles are too large or too small.

As such a paste, the following conductor containing paste is optimal: a conductor containing paste prepared by mixing 85 to 97 parts by weight of the metal particles or the conductive ceramic particles; 1.5 to 10 parts by weight of at least one binder selected from acrylic type, ethylcellulose, butylcellusolve and polyvinyl alcohol; 1.5 to 10 parts by weight of at least one solvent selected from α-terpineol, glycol, ethyl alcohol, and butanol.

A conductor containing paste is filled into the holes formed by punching, so as to obtain conductor-filled through hole printed units 53,54.

Next, as shown in FIG. 7(a), the green sheet 50 having the printed units 51, 52, 53 and 54 and the green sheet 50' are made into a lamination. The reason why the green sheet 50' having no printed units is deposited, at the side where the resistance heating elements are formed, is that the following phenomenon is prevented: the end faces of the conductor-filled through holes are exposed and the end faces thereof are oxidized at the time of the sintering on the formation of the resistance heating elements. If the sintering on the formation of the resistance heating elements is performed in the state that the end faces of the conductor-filled through holes are exposed, it is necessary to sputter a metal which is not practically oxidized, such as nickel. More preferably, the end faces may be covered with brazing gold of Au—Ni.

(2) Next, as shown in FIG. 7(b), the lamination is heated and pressed to sinter the green sheets and the conductor containing paste.

The heating temperature at the time of the sintering is preferably from 1000 to 2000° C. and the pressure is preferably from 100 to 200 kg/cm². The heating and the pressing are performed in the atmosphere of inert gas. As the inert gas, argon, nitrogen and the like can be used. In this sintering step, conductor-filled through holes 16,17, the chuck positive electrostatic layer 2, the chuck negative electrostatic layer 3, the resistance heating elements 5 and so on are formed.

(3) Next, as shown in FIG. 7(c), blind holes 13,14 for connecting external terminal pins are made.

It is desirable that a part of inner walls of the blind holes 13,14 is made conductive and the conductive inner walls are connected to the chuck positive electrostatic layer 2, the chuck negative electrostatic layer 3, the resistance heating elements 5 and so on.

(4) Finally, as shown in FIG. 7(d), external terminals 6,18 are fitted into the blind holes 13,14 through brazing gold. If necessary, a bottomed hole 11 may be made so that a thermocouple may be buried therein.

As solder, an alloy such as silver-lead, lead-tin or bismuth-tin can be used. The thickness of the solder layer is desirably from 0.1 to 50 $\mu$m. This is because this range is a range sufficient for maintaining the connection based on the solder.

In the above description, the electrostatic chuck 101 (reference to FIG. 1) is given as an example. In the case that the electrostatic chuck 201 (reference to FIG. 4) is produced, it is advisable to: produce a ceramic plate having an electrostatic electrode layer first; then print a conductor containing paste on the bottom surface of this ceramic plate and sinter the resultant to form the resistance heating elements 15; and then form the metal layer 150 by electroless plating and the like.

In the case that the electrostatic chuck 301 (reference to FIG. 5) is produced, it is advisable that: firstly, a metal foil or a metal wire is embedded as electrostatic electrodes or resistance heating elements, in ceramic powder; and then the resultant is sintered.

In the case that the electrostatic chuck 401 (reference to FIG. 6) is produced, it is advisable that: firstly a ceramic plate having an electrostatic electrode layer is produced; and then a Peltier device is jointed to the ceramic plate through a flame sprayed metal layer.

The above-mentioned ceramic substrate functions as a wafer prober in the following case that: conductors are arranged: on the surface of the ceramic substrate of the present invention; and inside the ceramic substrate, and the inside conductor is at least one of a guard electrode or a ground electrode.

Figure 11:
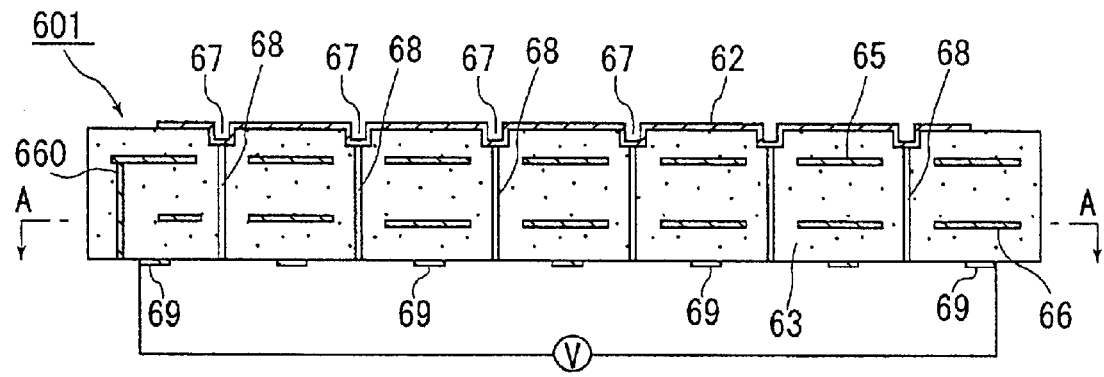
FIG. 11 is a sectional view that schematically illustrates a wafer prober according to the present invention.
Figure 12:
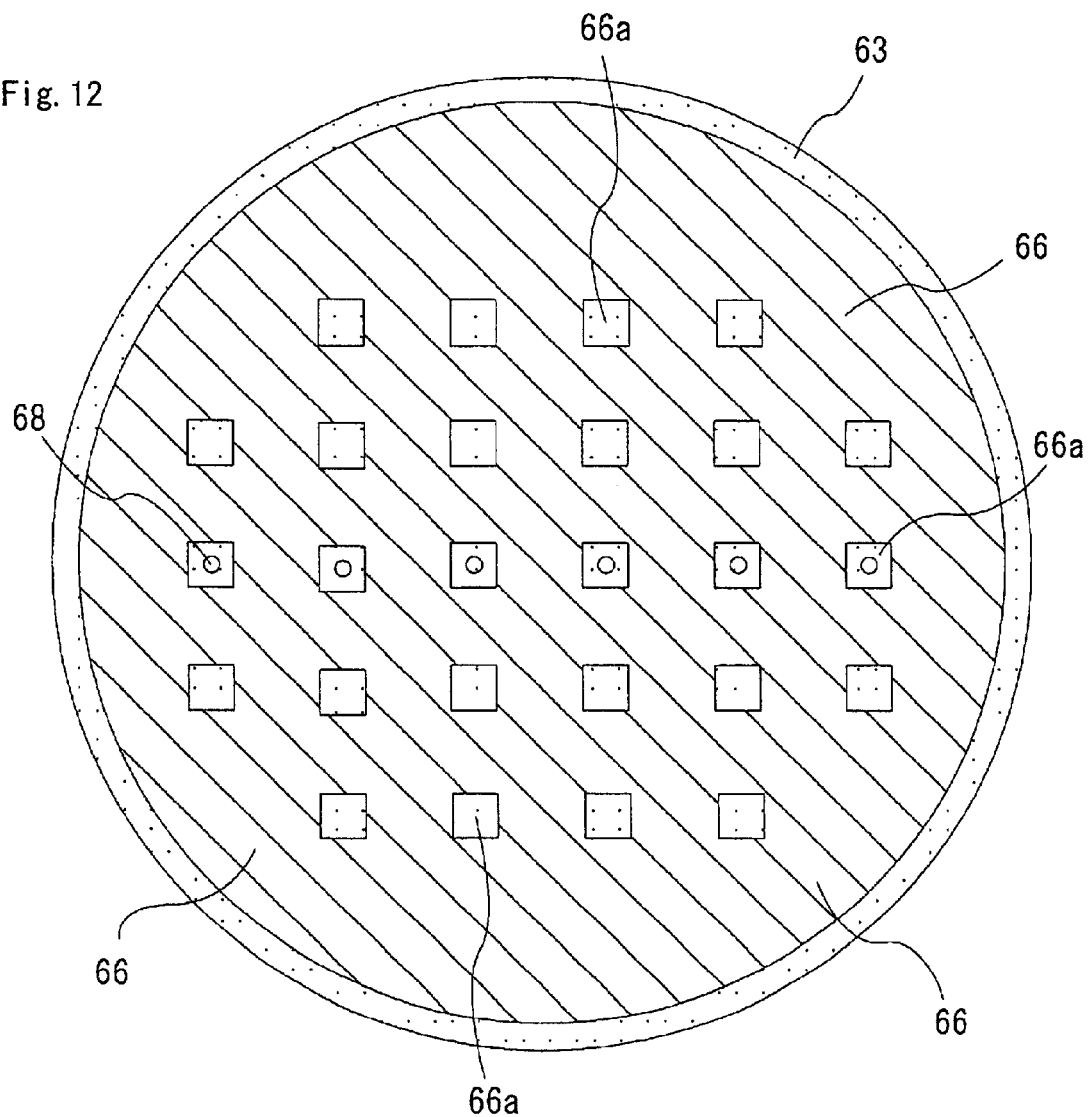
FIG. 12 is a sectional view that schematically illustrates a guard electrode of the wafer prober according to the present invention.

FIG. 11 is a sectional view that schematically shows one embodiment of the wafer prober according to the present invention. FIG. 12 is a sectional view taken along A—A line in the wafer prober shown in FIG. 11.

In this wafer prober 601, grooves 67, in the form of concentric circles as viewed from the above, are formed on the surface of a disc-form ceramic substrate 63. Moreover, suction holes 68 for sucking a silicon wafer are formed in a part of the grooves 67. A chuck top conductor layer 62 for connecting electrodes of the silicon wafer is formed, in a circular form, in the greater part of the ceramic plate 63 including the grooves 67.

On the other hand, heating elements 69 as shown in FIG. 3, in the form of concentric circles as viewed from the above, are disposed on the bottom surface of the ceramic substrate 63 to control the temperature of the silicon wafer. External terminal pins (not illustrated) are connected and fixed to both ends of the heating element 69.

Inside the ceramic substrate 63, a guard electrode 65 and a ground electrode 66 (reference to FIGS. 7), in the form of a lattice as viewed from the above, are disposed to remove stray capacitors and noise. The material of the guard electrode 65 and the ground electrode 66 may be the same as that of the electrostatic electrode.

The thickness of the chuck top conductor layer 62 is desirably from 1 to 20 $\mu$m. If the thickness is below 1 $\mu$m, its resistance is too high to function as an electrode. On the other hand, if the thickness is over 20 $\mu$m, the layer exfoliates easily by stress that the conductor has.

As the chuck top conductor layer 62, there can be used, for example, at least one metal selected from high melting point metals such as copper, titanium, chromium, nickel, noble metals (gold, silver, platinum and so on), tungsten and molybdenum.

According to the wafer prober having such a structure, a continuity test can be performed by putting a silicon wafer on which integrated circuits are formed, pushing a probe card having tester pins against the silicon wafer, and applying a voltage thereto while heating and cooling the wafer.

In the case that a wafer prober is produced, for example, a ceramic substrate wherein resistance heating elements are embedded is firstly produced in the same manner as in the case of the electrostatic chuck. Thereafter, grooves are made on the surface of the ceramic substrate and subsequently the surface on which the grooves are formed is subjected to sputtering, plating and so on, to form a metal layer.

BEST MODES FOR CARRYING OUT THE INVENTION

The present invention will be described in more detailed hereinafter.

EXAMPLE 1 AND COMPARATIVE EXAMPLE 1

Production of an Electrostatic Chuck (Reference to FIG. 1)

(1) The following paste was used to conduct formation by a doctor blade method to obtain a green sheet of 0.47 mm in thickness: a paste obtained by mixing 100 parts by weight of aluminum nitride powder (made by Tokuyama Corp., average particle diameter: 1.1 $\mu$m) fired at 500° C. for 0, 1 or 7 hours in the air, 4 parts by weight of yttria (average particle diameter: 0.4 $\mu$m), 11.5 parts by weight of an acrylic binder, 0.5 part by weight of a dispersant and 53 parts by weight of mixed alcohols of 1-butanol and ethanol.

(2) Next, this green sheet was dried at 80° C. for 5 hours, and subsequently the following holes were made by punching: holes of 1.8 mm, 3.0 mm and 5.0 mm in diameter which would be through holes through which semiconductor wafer lifter pins would be inserted; and holes which would be conductor-filled through holes for connecting external terminals.

(3) The following were mixed to prepare a conductor containing paste A: 100 parts by weight of tungsten carbide particles having an average particle diameter of 1 $\mu$m, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 $\mu$m, 1.9 parts by weight of an acrylic binder, 3.7 parts by weight of α-terpineol solvent, and 0.2 part by weight of a dispersant.

This conductor containing paste A was printed on the green sheet by screen printing to form a conductor containing paste layer. The pattern of the printing was made into a concentric pattern. Furthermore, conductor containing paste layers having an electrostatic electrode pattern shown in FIG. 2 were formed on other green sheets.

Moreover, the conductor containing paste B was filled into the through holes for the conductor-filled through holes for connecting external terminal.

Thirty four green sheets 50' on which no conductor containing paste A was printed were stacked on the upper side (heating surface) of the green sheet 50 that had been subjected to the above-mentioned processing, and the same thirteen green sheets 50' were stacked on the lower side of the green sheet 50. The green sheet 50 on which the conductor containing paste layer having the electrostatic electrode pattern was printed was stacked thereon. Furthermore, two green sheets 50' on which no tungsten paste was printed were stacked thereon. The resultant was pressed at the temperature of 130° C. and a pressure of 80 kg/cm$^2$ to form a lamination (FIG. 7(a)).

(4) Next, the resultant lamination was degreased at 600° C. in the atmosphere of nitrogen gas for 5 hours and hot-pressed at a temperature of 1890° C. and a pressure of 0 to 150 kg/cm$^2$ (the detail thereof is shown in Table 1) for 3 hours to obtain an aluminum nitride plate of 3 mm in thickness. This was cut off into a disk of 230 mm in diameter to prepare a plate made of aluminum nitride and having therein resistance heating elements 5 having a thickness of 6 $\mu$m and a width of 10 mm, a chuck positive electrostatic layer 2 having a thickness of 10 $\mu$m, and a chuck negative electrostatic layer 3 having a thickness of 10 $\mu$m (FIG. 7(b)).

(5) Next, the plate obtained in the (4) was ground with a diamond grindstone. Subsequently a mask was put thereon, and bottomed holes (diameter: 1.2 mm, and depth: 2.0 mm) for thermocouples were made on the surface by blast treatment with SiC and the like.

(6) Furthermore, portions where the conductor-filled through holes were made were hollowed out to make blind holes 13,14 (FIG. 7(c)). Brazing gold made of Ni—Au was heated and allowed to reflow at 700° C. to connect external terminals 6,18 made of Kovar to the blind holes 13,14 (FIG. 7(d)).

About the connection of the external terminals, a structure wherein a support of tungsten supports at three points, is desirable. This is because the reliability of the connection can be kept.

(7) Next, thermocouples for controlling temperature were buried in the bottomed holes to finish the production of an electrostatic chuck having the resistance heating elements.

The porosity, the pore diameter, the breakdown voltage, the fracture toughness value, the adsorption power, the temperature-rising property and the warp amount of the thus-produced electrostatic chuck having the resistance heating element were measured by the methods which will be described later.

The results are shown in Tables 1, 2. Depending on the length of the time when the nitride aluminum powder was being fired, the oxygen amounts contained in the ceramic substrates were different, and the values thereof are shown in Table 1. According to the measurement of the thermal conductivity by a laser flash method, it was 180 to 200 W/m·K.

EXAMPLE 2 AND COMPARATIVE EXAMPLE 2

Production of an Electrostatic Chuck (Reference to FIG. 4)

(1) The following paste was used to conduct formation by a doctor blade method to obtain a green sheet of 0.47 mm in thickness: a paste obtained by mixing 100 parts by weight of aluminum nitride powder (made by Tokuyama Corp., average particle diameter: 1.1 $\mu$m) fired at 500° C. for 0, 1 or 7 hours in the air, 4 parts by weight of yttria (average particle diameter: 0.4 $\mu$m), 11.5 parts by weight of an acrylic binder, 0.5 part by weight of a dispersant, 0, 3 or 5% by weight (the detail thereof is shown in Table 3) of BN, and 53 parts by weight of mixed alcohols of 1-butanol and ethanol.

(2) Next, this green sheet was dried at 80° C. for 5 hours, and subsequently the following portions were made by punching: portions which would be through holes of 1.8 mm, 3.0 mm and 5.0 mm in diameter, through which semiconductor wafer lifter pins would be inserted; and portions which would be conductor-filled through holes for connecting external terminals.

(3) The following were mixed to prepare a conductor containing paste A: 100 parts by weight of tungsten carbide particles having an average particle diameter of 1 μm, 3.0 parts by weight of an acrylic binder, 3.5 parts by weight of α-terpineol solvent, and 0.3 part by weight of a dispersant.

The following were mixed to prepare a conductor containing paste B: 100 parts by weight of tungsten particles having an average particle diameter of 3 μm, 1.9 parts by weight of an acrylic binder, 3.7 parts by weight of α-terpineol solvent, and 0.2 part by weight of a dispersant.

This conductor containing paste A was printed on the green sheet by screen printing to form a conductor containing paste layer of an electrostatic electrode pattern having a shape shown in FIG. 9.

Moreover, the conductor containing paste B was filled into the through holes for the conductor-filled through holes for connecting external terminals.

A green sheet on which no conductor containing paste A was printed were stacked on the upper side (heating surface) of the green sheet that had been subjected to the above-mentioned processing, and the same 48 green sheets were stacked on the lower side of the green sheet. The resultant was pressed at the temperature of 130° C. and a pressure of 80 kg/cm² to form a lamination.

(4) Next, the resultant lamination was degreased at 600° C. in the atmosphere of nitrogen gas for 5 hours and hot-pressed at the temperature of 1890° C. and a pressure of 0 to 150 kg/cm² (the detail thereof is shown in Table 3) for 3 hours to obtain an aluminum nitride plate of 3 mm in thickness. This was cut off into a disk of 230 mm in diameter to prepare a plate made of aluminum nitride and having therein chuck positive electrostatic layers 32a,b having a thickness of 15 μm, and chuck negative electrostatic layers 33a,b having a thickness of 15 μm (reference to FIG. 9).

(5) A mask was put onto the plate obtained in the (4), and concave portions (not illustrated) for thermocouples were made in the surface by blasting treatment with SiC and the like.

(6) Next, resistance heating elements 15 were printed on the surface (bottom surface) opposite to the wafer-putting surface. A conductor containing paste was used for the printing. The used conductor containing paste was Solvest PS603D made by Tokuriki Kagaku Kenkyu-zyo, which is used to form through holes in printed circuit boards.

This conductor containing paste was a silver/lead paste, and contained 7.5 parts by weight of metal oxides consisting of lead oxide, zinc oxide, silica, boron oxide and alumina (the weight ratio thereof was 5/55/10/25/5) per 100 parts by weight of silver.

The shape of the silver was scaly and had an average particle diameter of 4.5 μm.

(7) The plate on which the conductor containing paste was printed was heated and fired at 780° C. to sinter silver and lead in the conductor containing paste and further bake them onto the ceramic substrate. The heater plate was immersed in a bath for electroless nickel plating consisting of an aqueous solution containing 30 g/L of nickel sulfate, 30 g/L of boric acid, 30 g/L of ammonium chloride, and 60 g/L of a Rochelle salt, to precipitate a nickel layer 150 having a thickness of 1 μm and a boron content of 1% or less by weight on the surface of the sintered body 15 of silver. Thereafter, the plate was annealed at 120° C. for 3 hours.

The resistance heating elements made of the sintered silver had a thickness of 5 μm, a width of 2.4 mm and a area resistivity of 7.7 mΩ/□.

(8) Next, blind holes for causing the conductor-filled through holes 16 to be exposed were made in the ceramic substrate. Brazing gold made of Ni—Au (Au: 81.5% by weight, Ni: 18.4% by weight, impurities: 0.1% by weight) was heated and allowed to reflow at 970° C. to connect external terminal pins made of Kovar to the blind holes. External terminal pins made of Kovar were formed on the resistance heating element through a solder (tin 9/lead 1).

(9) Next, thermocouples for controlling temperature were buried in the concave portions to obtain an electrostatic chuck 201.

The porosity, the pore diameter, the breakdown voltage, the fracture toughness value, the adsorption power, the temperature-rising property and the warp amount of the thus-produced electrostatic chuck having the resistance heating element were measured by the methods which will be described later. The results are shown in Tables 3,4 shown below. Depending on the length of the time when the nitride aluminum powder was being fired, the oxygen amounts contained in the ceramic substrates were different, and the values thereof are shown in Table 3.

(10) Next, this electrostatic chuck 201 was fitted into a supporting case 41 having a sectional shape shown in FIG. 10 and made of stainless steel through a heat insulator 45 made of ceramic fiber (made by Ibiden Co., Ltd., trade name: Ibiwool). This supporting case 41 had coolant outlets 42 to make it possible to adjust the temperature of the electrostatic chuck 201.

An electric current was passed through the resistance heating elements 15 of the electrostatic chuck 201 fitted into this supporting case 41 to raise the temperature thereof. Thus, a coolant was caused to flow through the supporting case to control the temperature of the electrostatic chuck 201. The temperature was allowed to be controlled very satisfactorily.

EXAMPLE 3 AND COMPARATIVE EXAMPLE 3

Production of an Electrostatic Chuck 301
(Reference to FIG. 5)

(1) A tungsten foil having a thickness of 10 μm was punched out to form two electrodes having a shape illustrated in FIG. 8.

The two electrodes and a tungsten wire, together with 100 parts by weight of nitride aluminum powder (made by Tokuyama Corp., average particle diameter: 1.1 μm) fired at 500° C. for 0, 1 or 7 hours in the air, 4 parts by weight of yttria (average particle diameter: 0.4 μm), and 0, 1.5, 3.5 or 15% by weight of alumina, were put into a mold, and then the mixture was hot-pressed at a temperature of 1890° C. and a pressure of 0 to 150 kg/cm² (the detail thereof is shown in Table 5) for 3 hours in nitrogen gas, so as to obtain a nitride aluminum plate having a thickness of 3 mm. This was cut off into a disk having a diameter of 230 mm, so as to prepare a plate. At this time, the thickness of the electrostatic electrode layer was 10 µm.

(2) This plate was subjected to the steps (5) to (7) in Example 1, so as to obtain an electrostatic chuck 301.

The porosity, the pore diameter, the breakdown voltage, the fracture toughness value, the adsorption power, the temperature-rising property and the warp amount of the thus-produced electrostatic chuck having the resistance heating element were measured by the following methods. The results are shown in Tables 5,6.

Depending on the length of the time when the nitride aluminum powder was being fired, the oxygen amounts contained in the ceramic substrates were different, and the values thereof are shown in Table 5.

Evaluation Method (1) Oxygen Amount

A sample sintered under the same conditions as for the sintered bodies according to each Example was pulverized in a tungsten mortar, and then 0.01 g of the resultant was collected and oxygen amount was measured under conditions of a sample-heating temperature of 2200° C. and a heating time of 30 seconds by means of an oxygen/nitrogen determinator (TC-136 model, made by LECO company).

(2) Measurement of the Porosity of a Ceramic Dielectric Film

A ceramic dielectric film was cut off and the porosity thereof was measured by Archimedes' method. Specifically, the cut-off sample was crushed into pieces, and the pieces were put into an organic solvent or mercury to measure the volume thereof. Furthermore, the true specific gravity was measured from the before hand-measured weight of the powder and the measured volume, to calculate the porosity from this true specific gravity and the apparent specific gravity.

(3) Measurement of the Pore Diameter of a Ceramic Dielectric Film

An electrostatic chuck was cut in the longitudinal direction at several points. About pores in the cut area, the length thereof was measured with a microscope. When the lengths of lateral and longitudinal directions thereof were different, the maximum value thereof was selected.

(4) Evaluation of the Breakdown Voltage of a Ceramic Dielectric Film

A metal electrode was put on each electrostatic chuck produced in Examples 1 to 3 and Comparative Examples 1 to 3, and then a voltage was applied between the electrostatic electrode layer and the electrode. In this way, the voltage at which dielectric breakdown was caused was measured.

(5) Fracture Toughness Value

An indentator of a Vickers hardness meter (MVK-D model, made by Akashi Seisakusyo company) was pressed onto the surface, and then the length of the generated crack was measured. This was substituted in the following calculating equation.

Fracture toughness value=$0.026 \times E^{1/2} \times 0.5 \times p^{1/2} \times a \times C^{-3/2}$ E represents a Young's modulus ($3.18 \times 10^{11}$ Pa), P represents a pressing load (98 N), a represents a half (m) of the length of diagonal line of the indentation, and C represents a half (m) of the average length of the crack.

(6) Adsorption Power

A load cell (Autograph, AGS-50A, made by Shimadzu Corp.) was used to make a measurement.

(7) Temperature-rising Property

A time necessary for raising the temperature up to 450° C. was measured.

(8) Warp Amount

The temperature of a sample was raised up to 450° C. and a load of 150 kg/cm² was applied thereto. Thereafter, the sample was cooled to 25° C. and then a shape-measuring device (Nanoway, made by Kyocera Corp.) was used to measure the warp amount.

TABLE 1

| Oxygen (% by weight) | Pressure (kgf/cm²) | Porosity (%) | Maximum pore diameter (µm) |
|---|---|---|---|
| Example 1 | | | |
| 1.6 | 150 | 0.05 | 0.1 |
| 1.6 | 100 | 0.1 | 1.1 |
| 1.6 | 80 | 1.1 | 2.2 |
| 1.6 | 70 | 2.1 | 5.0 |
| 1.6 | 50 | 3.3 | 10 |
| 1.6 | 0 | 4.1 | 45 |
| 1.6 | 150 | Below the limit | Not observed |
| Comparative Example 1 | | | |
| <0.05 | 100 | 1.0 | 1 |
| 1.6 | 0 | 4.2 | 55 |
| <0.05 | 0 | 6.1 | 60 |
| 6 | 150 | 1.1 | 1 |

TABLE 2

| Breakdown voltage (kV/mm) | | | Fracture toughness value (MPam$^{1/2}$) | Adsorption power 450° C. (kg/cm²) | Temperature-rising property (seconds) | Warp amount (µm) |
|---|---|---|---|---|---|---|
| 25° C. | 200° C. | 450° C. | | | | |
| Example 1 | | | | | | |
| 15 | 10 | 5 | 3.5 | 1.0 | 45 | 1 |
| 15 | 10 | 5 | 3.6 | 1.1 | 46 | 1 |
| 14 | 9 | 4 | 3.8 | 0.9 | 45 | 2 |
| 14 | 9 | 3 | 3.5 | 1.0 | 45 | 2 |
| 13 | 8 | 3 | 3.6 | 0.8 | 45 | 2 |

TABLE 2-continued

| Breakdown voltage (kV/mm) | | | Fracture toughness | Adsorption power 450° C. | Temperature-rising property | Warp amount |
|---|---|---|---|---|---|---|
| 25° C. | 200° C. | 450° C. | value (MPam$^{1/2}$) | (kg/cm$^2$) | (seconds) | ($\mu$m) |
| 12 | 5 | 1 | 3.6 | 0.9 | 50 | 7 |
| 20 | 15 | 10 | 3.0 | 1.2 | 40 | 0 |
| Comparative Example 1 | | | | | | |
| 2 | 1 | 0.5 | 3.5 | Dielectric breakdown | 45 | 1 |
| 2 | 0.8 | 0.4 | 3.5 | Dielectric breakdown | 80 | 8 |
| 2 | 0.5 | 0.1 | 3.5 | Dielectric breakdown | 80 | 8 |
| 15 | 7 | 0.9 | 3.6 | Dielectric breakdown | 80 | 1 |

TABLE 3

| BN amount (% by weight) | Oxygen (% by weight) | Pressure (kgf/cm$^2$) | Porosity (%) | Maximum pore diameter ($\mu$m) |
|---|---|---|---|---|
| Example 2 | | | | |
| 3 | 1.6 | 150 | 0.03 | 0.1 |
| 3 | 1.6 | 100 | 0.1 | 1.1 |
| 3 | 1.6 | 80 | 1.2 | 2.2 |
| 3 | 1.6 | 70 | 2.1 | 4.9 |
| 3 | 1.6 | 50 | 3.2 | 9 |
| 0 | 1.6 | 0 | 4.3 | 48 |
| 0 | 1.6 | 150 | Below the limit | Not observed |
| Comparative Example 2 | | | | |
| 3 | <0.05 | 100 | 1.1 | 1.0 |
| 5 | 1.6 | 0 | 4.1 | 55 |
| 3 | <0.05 | 0 | 6.2 | 60 |
| 3 | 6 | 150 | 1.1 | 1.1 |

TABLE 5

| Alumina (% by weight) | Oxygen (% by weight) | Pressure (kgf/cm$^2$) | Porosity (%) | Maximum pore diameter ($\mu$m) |
|---|---|---|---|---|
| Example 3 | | | | |
| 1.5 | 0.7 | 150 | 0.03 | 0.1 |
| 1.5 | 0.7 | 100 | 0.1 | 1.1 |
| 1.5 | 0.7 | 80 | 1.2 | 2.2 |
| 1.5 | 0.7 | 70 | 2.1 | 4.9 |
| 1.5 | 0.7 | 50 | 3.2 | 10 |
| 1.5 | 0.7 | 0 | 4.3 | 48 |
| Comparative Example 3 | | | | |
| 0 | <0.05 | 150 | 1.1 | 1.0 |
| 3.5 | 1.6 | 0 | 4.1 | 55 |
| 0 | <0.05 | 0 | 6.2 | 60 |
| 15 | 6 | 150 | 1.1 | 1.1 |

TABLE 4

| Breakdown voltage (kV/mm) | | | Fracture toughness | Adsorption power 450° C. | Temperature-rising property | Warp amount |
|---|---|---|---|---|---|---|
| 25° C. | 200° C. | 450° C. | value (MPam$^{1/2}$) | (kg/cm$^2$) | (seconds) | ($\mu$m) |
| Example 2 | | | | | | |
| 16 | 10 | 5 | 3.6 | 1.0 | 45 | 1 |
| 15 | 10 | 5 | 3.5 | 1.1 | 46 | 1 |
| 14 | 9 | 4 | 3.7 | 0.9 | 45 | 2 |
| 13 | 9 | 3 | 3.5 | 1.0 | 45 | 2 |
| 13 | 8 | 3 | 3.5 | 0.8 | 45 | 2 |
| 11 | 5 | 1 | 3.5 | 0.9 | 50 | 7 |
| 20 | 15 | 10 | 3.0 | 1.2 | 40 | 0 |
| Comparative Example 2 | | | | | | |
| 2 | 1 | 0.5 | 3.5 | Dielectric breakdown | 45 | 1 |
| 2 | 0.8 | 0.4 | 3.5 | Dielectric breakdown | 80 | 8 |
| 2 | 0.5 | 0.1 | 3.5 | Dielectric breakdown | 80 | 8 |
| 15 | 7 | 0.9 | 3.6 | Dielectric breakdown | 80 | 1 |

TABLE 6

| Breakdown voltage (kV/mm) | | | Fracture toughness value (MPam$^{1/2}$) | Adsorption power 450° C. (kg/cm$^2$) | Temperature-rising property (seconds) | Warp amount ($\mu$m) |
|---|---|---|---|---|---|---|
| 25° C. | 200° C. | 450° C. | | | | |
| Example 3 | | | | | | |
| 16 | 10 | 5 | 3.6 | 1.0 | 55 | 1 |
| 15 | 10 | 5 | 3.5 | 1.1 | 50 | 1 |
| 14 | 9 | 4 | 3.7 | 0.9 | 53 | 2 |
| 13 | 9 | 3 | 3.5 | 1.0 | 55 | 2 |
| 13 | 8 | 3 | 3.5 | 0.8 | 51 | 2 |
| 11 | 5 | 1 | 3.5 | 0.9 | 55 | 7 |
| Comparative Example 3 | | | | | | |
| 2 | 1 | 0.4 | 3.5 | Dielectric breakdown | 45 | 1 |
| 2 | 0.7 | 0.3 | 3.5 | Dielectric breakdown | 80 | 8 |
| 2 | 0.5 | 0.1 | 3.5 | Dielectric breakdown | 80 | 8 |
| 15 | 7 | 0.9 | 3.6 | Dielectric breakdown | 80 | 1 |

As is clear from the above-described Tables 1 to 6, in the electrostatic chucks according to Examples 1 to 3, the breakdown voltage of the ceramic dielectric films is as good as 11 to 20 kV/mm at ambient temperature and 1 to 10 kV/mm even at 450° C. In the cases having pores, a fracture toughness value of 3.5 MPam$^{1/2}$ or more can be ensured. By setting the pore diameter of the maximum pore to 50 $\mu$m or less, the warp amount at high temperature can be made small. In the cases having no pores, the breakdown voltage becomes very high and the warp can be substantially completely lost.

EXAMPLE 4

Production of an Electrostatic Chuck 401
(Reference to FIG. 6)

The steps (1) to (5) (with the condition in the first line in Table 3) in Example 2 were carried out and then nickel was thermally sprayed onto the bottom surface. Thereafter, a lead/tellurium type Peltier device was jointed thereto, so as to obtain an electrostatic chuck 401.

The thus-produced electrostatic chuck was superior in temperature-falling property. Thus, when the chuck was cooled by means of the Peltier device, the temperature fell from 450 ° C. to 100° C. in 3 minutes.

EXAMPLE 5

Production of a Wafer Prober 601 (Reference to FIG. 11)

(1) The following paste was used to conduct formation by a doctor blade method to obtain a green sheet of 0.47 mm in thickness: a paste obtained by mixing 1000 parts by weight of aluminum nitride powder (made by Tokuyama Corp., average particle diameter: 1.1 $\mu$m) fired at 500° C. for 1 hour in the air, 40 parts by weight of yttria (average particle diameter: 0.4 $\mu$m), 10 parts by weight of SiC and 530 parts by weight of mixed alcohols of 1-butanol and ethanol.

(2) Next, this green sheet was dried at 80° C. for 5 hours, and subsequently through holes for conductor-filled through holes for connecting external terminals pins to heating elements were made by punching.

(3) The following were mixed to prepare a conductor containing paste A: 100 parts by weight of tungsten carbide particles having an average particle diameter of 1 $\mu$m, 3.0 parts by weight of an acrylic binder, 3.5 parts by weight of $\alpha$-terpineol solvent, and 0.3 part by weight of a dispersant.

The following were mixed to prepare a conductor containing paste B: 100 parts by weight of tungsten particles having an average particle diameter of 3 $\mu$m, 1.9 parts by weight of an acrylic binder, 3.7 parts by weight of $\alpha$-terpineol solvent, and 0.2 part by weight of a dispersant.

Next, a printed unit for a guard electrode and a printed unit for a ground electrode in a lattice form were printed on the green sheet by screen printing using this conductor containing paste A.

Moreover, the conductor containing paste B was filled into the through holes for the conductor-filled through holes for connecting external terminal pins.

Fifty green sheets on which the paste was printed and no paste was printed were stacked. The resultant was pressed at the temperature of 130° C. and a pressure of 80 kg/cm$^2$ to form a lamination.

(4) Next, this lamination was degreased at 600° C. in the atmosphere of nitrogen gas for 5 hours and hot-pressed at a temperature of 1890° C. and a pressure of 150 kg/cm$^2$ for 3 hours to obtain a aluminum nitride plate of 3 mm in thickness. The resultant plate was cut off into a disk of 300 mm in diameter to prepare a ceramic plate. About the size of the conductor-filled through holes 660, their diameter was 0.2 mm and their depth was 0.2 mm.

The thickness of the guard electrode 65 and the ground electrode 66 was 10 $\mu$m. The position where the guard electrode 65 was formed was 1 mm apart from the wafer-putting surface. The position where the ground electrode 66 was formed was 1.2 mm apart from the wafer-putting surface. The length of one side of each non-conductor forming area 66a in the guard electrode 65 and the ground electrode 66 was 0.5 mm.

(5) Next, the plate obtained in the (4) was ground with a diamond grindstone. Subsequently a mask was put thereon, and concaves for thermocouples and grooves 67 (width: 0.5 mm, and depth: 0.5 mm) for adsorbing a wafer were made in the surface by blast treatment with SiC and the like.

(6) Furthermore, a layer for forming heating elements 69 was printed on the surface opposite to the wafer-putting surface. A conductor containing paste was used for the printing. The used conductor containing paste was Solvest PS603D made by Tokuriki Kagaku Kenkyu-zyo, which is used to form through holes in printed circuit boards. This paste was a silver/lead paste, and contained 7.5 parts by weight of metal oxides comprising lead oxide, zinc oxide, silica, boron oxide and alumina (the weight ratio thereof was 5/55/10/25/5) per 100 parts by weight of silver.

The shape of the silver was scaly and had an average particle diameter of 4.5 $\mu$m.

(7) The heater plate on which the conductor containing paste was printed was heated and fired at 780° C. to sinter silver and lead in the conductor containing paste and further bake them onto the ceramic substrate 63. The heater plate was immersed in a bath for electroless nickel plating consisting of an aqueous solution containing 30 g/L of nickel sulfate, 30 g/L of boric acid, 30 g/L of ammonium chloride, and 60 g/L of a Rochelle salt, to precipitate a nickel layer (not illustrated) having a thickness of 1 $\mu$m and a boron content of 1% or less by weight on the surface of the sintered body 69 of silver. Thereafter, the heater plate was annealed at 120° C. for 3 hours.

The heating elements made of the sintered silver had a thickness of 5 $\mu$m, a width of 2.4 mm and a area resistivity of 7.7 m$\Omega$/□.

(8) By sputtering, a titanium layer, a molybdenum layer and a nickel layer were successively formed on the surface in which the grooves 67 were made. The used machine for the sputtering was SV-4540 made by ULVAC Japan, Ltd. About conditions for the sputtering, air pressure was 0.6 Pa, temperature was 100° C. and electric power was 200 W. Sputtering time was within the range of 30 seconds to 1 minute, and was adjusted dependently on the respective metals.

About the thickness of the resultant films, an image from a fluorescent X-ray analyzer demonstrated that the thickness of the titanium layer was 0.3 $\mu$m, that of the molybdenum layer was 2 $\mu$m and that of the nickel layer was 1 $\mu$m.

(9) The plate obtained in the item (8) was immersed in a bath for electroless nickel plating consisting of an aqueous solution containing 30 g/L of nickel sulfate, 30 g/L of boric acid, 30 g/L of ammonium chloride, and 60 g/L of a Rochelle salt to precipitate a nickel layer having a thickness of 7 $\mu$m and a boron content of 1% or less by weight on the surface of the metal layer made by the sputtering. Thereafter, the resultant ceramic substrate was annealed at 120° C. for 3 hours.

No electric current was allowed to pass on the surface of the heating elements, and the surface was not coated with any electroplating nickel.

The plate was immersed in an electroless gold plating solution containing 2 g/L of potassium gold cyanide, 75 g/L of ammonium chloride, 50 g/L of sodium citrate, and 10 g/L of sodium hypophosphite at 93° C. for 1 minute to form a gold plating layer 1 $\mu$m in thickness on the nickel plating layer.

(10) Air suction holes 68 reaching the back surface from the grooves 67 were made by drilling, and then blind holes (not illustrated) for exposing the conductor-filled through holes 660 were made. Brazing gold made of Ni—Au alloy (Au: 81.5% by weight, Ni: 18.4% by weight, and impurities: 0.1% by weight) was heated and allowed to reflow at 970° C. to connect external terminal pins made of Kovar to the blind holes. Then, external terminal pins made of Kovar were fitted through a solder (tin: 90% by weight, and lead: 10% by weight) on the heating elements.

(11) Next, thermocouples for controlling temperature were buried in the concaves to obtain a wafer prober heater 601.

In the thus-obtained ceramic substrate, the pore diameter of its maximum pore was 2 $\mu$m, and its porosity was 1%. The temperature of the ceramic substrate was raised to 200° C. Even if 200 V was applied thereto, no dielectric breakdown was caused. Its warp amount was 1 $\mu$m or less, which was good.

EXAMPLE 6 AND COMPARATIVE EXAMPLE 4

The following paste was used to conduct formation by a doctor blade method to obtain a green sheet of 0.5 mm in thickness: a paste obtained by mixing 100 parts by weight of silicon carbide powder (made by Yakushima Denko Co., Ltd., average particle diameter: 1.1 $\mu$m) fired at 500° C. for 0, 1 or 7 hours in the air, 4 parts by weight of carbon, 11.5 parts by weight of an acrylic binder, 0.5 part by weight of a dispersant and 53 parts by weight of mixed alcohols of 1-butanol and ethanol.

The same procedure as in the steps (2) to (7) in Example 1 was performed to produce an electrostatic chuck.

A glass paste was applied onto portions which will be contacting the conductor containing paste.

The porosity, the pore diameter, the breakdown voltage, the fracture toughness value, the adsorption power, the temperature-rising property and the warp amount of the thus-produced electrostatic chuck having the resistance heating element were measured in the same way as in Example 1. The results are shown in Tables 7,8. Depending on the length of the time when the nitride aluminum powder was being fired, the oxygen amounts contained in the ceramic substrates were different, and the values thereof are shown in Table 7. The breakdown voltage was measured between the wafer-putting surface and the electrostatic electrode.

TABLE 7

| Oxygen (% by weight) | Pressure (kgf/cm$^2$) | Porosity (%) | Maximum pore diameter ($\mu$m) |
| --- | --- | --- | --- |
| Example 6 | | | |
| 0.3 | 200 | 0.05 | 0.1 |
| 0.3 | 150 | 0.12 | 1.1 |
| 0.3 | 130 | 1.3 | 2.3 |
| 0.3 | 120 | 2.0 | 5.1 |
| 0.3 | 100 | 3.5 | 8 |
| 0.3 | 0 | 4.5 | 44 |
| 0.3 | 200 | Below the limit | Not observed |
| Comparative Example 4 | | | |
| <0.05 | 150 | 1.1 | 1 |
| 1.6 | 0 | 4.3 | 56 |
| <0.05 | 0 | 6.2 | 63 |
| 6 | 200 | 1.2 | 1 |

TABLE 8

| Breakdown voltage (kV/mm) | | | Fracture toughness value (MPam$^{1/2}$) | Adsorption power 450° C. (kg/cm$^2$) | Temperature-rising property (seconds) | Warp amount ($\mu$m) |
|---|---|---|---|---|---|---|
| 25° C. | 200° C. | 450° C. | | | | |
| Example 6 | | | | | | |
| 10 | 5 | 0.1 | 4.5 | 1.0 | 45 | 1 |
| 10 | 5 | 0.1 | 4.0 | 1.0 | 46 | 1 |
| 9 | 4 | 0.1 | 4.8 | 0.8 | 45 | 2 |
| 9 | 4 | 0.08 | 4.5 | 1.0 | 45 | 2 |
| 8 | 3 | 0.08 | 4.6 | 0.8 | 45 | 2 |
| 7 | 0.1 | 0.08 | 4.6 | 0.9 | 50 | 7 |
| 15 | 10 | 5 | 4.0 | 1.2 | 40 | 0 |
| Comparative Example 4 | | | | | | |
| 0.01 | 0.01 | 0.01 | 4.5 | Dielectric breakdown | 45 | 1 |
| 0.01 | 0.01 | 0.01 | 4.5 | Dielectric breakdown | 80 | 8 |
| 0.01 | 0.01 | 0.01 | 4.5 | Dielectric breakdown | 80 | 8 |
| 10 | 2 | 0.5 | 4.6 | Dielectric breakdown | 80 | 1 |

As is clear form Tables 7,8, in the electrostatic chuck according to Example 6, the breakdown voltage of its ceramic dielectric film was good. About the fracture toughness value thereof, 4.0 MPam$^{1/2}$ or more can be ensured. Furthermore, by setting the pore diameter of its maximum pore to 50 $\mu$m or less, the warp amount at high temperature can be made small.

EXAMPLE 7 AND COMPARATIVE EXAMPLE 5

Concave portions were made on the surface of the electrostatic chucks of Example 1 and Comparative Example 1 by drilling. Supporting pins made of alumina, for supporting a silicon wafer, were formed in the concave portions. The distance between the silicon wafer and the above-mentioned surface was set to 100 $\mu$m. They were named as Example 7 and Comparative Example 7.

Next, no voltage was applied onto the electrostatic electrodes, and an electric current was passed through only the resistance heating element to raise the temperature of the silicon wafer up to 400° C. A difference in the temperature of the surface of the silicon wafer was measured.

As a result, in the case that the warp amount of the ceramic substrate was 1 or 0 $\mu$, the difference in the surface temperature of the silicon wafer was 3° C., but in the case that the warp amount was 8 $\mu$m, the difference in the surface temperature of the silicon wafer was as much as 10° C. and this case was poor in the uniformity of the temperature of the silicon wafer.

TEST EXAMPLE

As in Comparative Example 1, aluminum nitride power was sintered, without being fired in the air, under a normal pressure so as to produce an electrostatic chuck having a thickness of 30 mm. Also, aluminum nitride power was sintered, without being fired in the air, under a normal pressure so as to produce an electrostatic chuck having a diameter of 150 mm. In both of the chucks, their warp amounts were 1 $\mu$m or less even if the temperatures thereof were raise to 450° C.

Namely, in the ceramic substrates having a thickness over 25 mm and having a diameter below 200 mm, the problem of warp was not originally caused. An electrostatic chuck wherein no through holes were made was produced. The warp amount thereof was 1 $\mu$m or less after the temperature was raised to 450° C.

As described above, it can be considered that the present invention is particularly advantageous for the ceramic substrate for a semiconductor-producing/examining device, having a thickness of 25 mm or less and a diameter of 200 $\mu$m or more and having through holes.

Industrial Applicability

As described above, in the ceramic substrate of the present invention, the ceramic substrate is made of a non-oxide ceramic containing oxygen. Thus, even if the pore diameter of its maximum pore is 50 $\mu$m or less, which is larger than that of conventional ceramic substrates, a sufficiently large breakdown voltage can be kept. Also, since the ceramic substrate has pores, the fracture toughness value thereof can be made large. As a result, the ceramic substrate can resist thermal impact. Furthermore, the warp amount thereof at high temperature can also be made small.

What is claimed is:

1. A ceramic heater for a semiconductor-producing/examining device, the ceramic heater comprising
    a ceramic substrate having a disc form including two opposing surfaces; and
    a resistance heating element on one of the two opposing surfaces of the ceramic substrate or inside the ceramic substrate, wherein
    the ceramic substrate comprises a non-oxide ceramic containing 0.05 to 5% by weight of oxygen; and
    the non-oxide ceramic has a maximum pore diameter of 5 $\mu$m or less.

2. The ceramic heater according to claim 1, wherein said non-oxide ceramic is a nitride ceramic.

3. The ceramic heater according to claim 1, wherein said non-oxide ceramic is a carbide ceramic.

4. The ceramic heater according to claim 1, wherein said ceramic substrate has a porosity of 5% or less.

5. The ceramic heater according to claim 1, wherein said ceramic substrate is capable of use within the temperature range of 100 to 700 C.

6. The ceramic heater according to claim 1, wherein said ceramic substrate has a thickness of 25 mm or less, and a diameter of 200 mm or more.

7. The ceramic heater according to claim 1, wherein said ceramic substrate has a plurality of through holes into which lifter pins for a semiconductor wafer are capable of being inserted.

8. The ceramic heater according to claim 1, wherein said ceramic substrate contains oxygen in an amount of 0.1 to 5% by weight.

9. The ceramic heater according to claim 1, wherein said ceramic substrate comprises an alkali metal oxide, an alkali earth metal oxide, or a rare earth element oxide.

10. The ceramic heater according to claim 1, wherein an electrostatic electrode or an RF electrode is embedded inside the ceramic substrate.

11. The ceramic heater according to claim 1, wherein said heating element is a Peltier device.

12. The ceramic heater according to claim 1, wherein said heating element is selected from the group consisting of a conductive ceramic, a metal foil, a metal sintered a metal wire.

13. The ceramic heater according to claim 1, wherein a chuck top conductor layer is formed on the surface of said ceramic substrate.

14. The ceramic heater according to claim 1, wherein said ceramic substrate contains BN.

* * * * *